US011043509B2

United States Patent
Koyama

(10) Patent No.: US 11,043,509 B2
(45) Date of Patent: Jun. 22, 2021

(54) TRANSISTOR, LIQUID CRYSTAL DISPLAY DEVICE, AND MANUFACTURING METHOD THEREOF

(71) Applicant: Semiconductor Energy Laboratory Co., Ltd., Atsugi (JP)

(72) Inventor: Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/234,990

(22) Filed: Dec. 28, 2018

(65) Prior Publication Data

US 2019/0139988 A1 May 9, 2019

Related U.S. Application Data

(60) Continuation of application No. 15/284,658, filed on Oct. 4, 2016, now Pat. No. 10,170,500, which is a (Continued)

(30) Foreign Application Priority Data

Sep. 10, 2010 (JP) ................................. 2010-203356

(51) Int. Cl.
*H01L 27/12* (2006.01)
*G02F 1/1362* (2006.01)
(Continued)

(52) U.S. Cl.
CPC .......... *H01L 27/124* (2013.01); *G02F 1/1368* (2013.01); *G02F 1/136213* (2013.01);
(Continued)

(58) Field of Classification Search
None
See application file for complete search history.

(56) References Cited

U.S. PATENT DOCUMENTS 5,477,355 A 12/1995 Sasaki et al.
5,731,856 A 3/1998 Kim et al.
(Continued)

FOREIGN PATENT DOCUMENTS

EP 1598860 A 11/2005
EP 1737044 A 12/2006
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Alexander G Ghyka
(74) *Attorney, Agent, or Firm* — Fish & Richardson P.C.

(57) ABSTRACT

Photolithography and etching steps for forming an island-shaped semiconductor layer are omitted, and a liquid crystal display device is manufactured with four photolithography steps: a step of forming a gate electrode (including a wiring formed using the same layer as the gate electrode), a step of forming source and drain electrodes (including a wiring formed using the same layer as the source and drain electrodes), a step of forming a contact hole (including the removal of an insulating layer and the like in a region other than the contact hole), and a step of forming a pixel electrode (including a wiring formed using the same layer as the pixel electrode). By the reduction in the number of photolithography steps, a liquid crystal display device can be provided at low cost and high productivity. Formation of a parasitic channel is prevented by an improvement in shape and potential of a wiring.

14 Claims, 19 Drawing Sheets

Related U.S. Application Data continuation of application No. 14/338,380, filed on Jul. 23, 2014, now Pat. No. 9,490,350, which is a division of application No. 13/226,812, filed on Sep. 7, 2011, now Pat. No. 8,797,487.

(51) Int. Cl.
*H01L 29/66* (2006.01)
*G02F 1/1368* (2006.01)
*H01L 29/24* (2006.01)
*H01L 29/786* (2006.01)
*H01L 29/417* (2006.01)

(52) U.S. Cl.
CPC ........ *G02F 1/136286* (2013.01); *H01L 27/12* (2013.01); *H01L 27/1214* (2013.01); *H01L 27/1225* (2013.01); *H01L 27/1255* (2013.01); *H01L 27/1288* (2013.01); *H01L 29/24* (2013.01); *H01L 29/66969* (2013.01); *H01L 29/7869* (2013.01); *G02F 1/136231* (2021.01); *G02F 2201/123* (2013.01); *H01L 29/41733* (2013.01)

(56) References Cited

U.S. PATENT DOCUMENTS

| | | |
|---|---|---|
| 5,744,864 A | 4/1998 | Cillessen et al. |
| 5,886,761 A | 3/1999 | Sasaki et al. |
| 6,043,511 A | 3/2000 | Kim |
| 6,294,274 B1 | 9/2001 | Kawazoe et al. |
| 6,404,465 B1 | 6/2002 | Nakayama et al. |
| 6,421,102 B2 | 7/2002 | Nakayama et al. |
| 6,429,057 B1 | 8/2002 | Hong et al. |
| 6,469,769 B2 | 10/2002 | Ozaki |
| 6,563,174 B2 | 5/2003 | Kawasaki et al. |
| 6,642,074 B2 | 11/2003 | Hong et al. |
| 6,682,961 B1 | 1/2004 | Kim |
| 6,720,199 B2 | 4/2004 | Matsubara |
| 6,724,443 B1 | 4/2004 | Sano et al. |
| 6,727,522 B1 | 4/2004 | Kawasaki et al. |
| 6,771,346 B2 | 8/2004 | Sugimoto et al. |
| 6,787,809 B2 | 9/2004 | Hong et al. |
| 6,862,070 B1 | 3/2005 | Sugimoto et al. |
| 6,969,643 B2 | 11/2005 | Kim |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,078,255 B2 | 7/2006 | Hong et al. |
| 7,105,868 B2 | 9/2006 | Nause et al. |
| 7,136,132 B2 | 11/2006 | Nakayama et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,335,573 B2 | 2/2008 | Takayama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,430,034 B2 | 9/2008 | Jeoung |
| 7,442,960 B2 | 10/2008 | Suh et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,290 B2 | 3/2009 | Hong et al. |
| 7,623,193 B2 | 11/2009 | Kim |
| 7,674,650 B2 | 3/2010 | Akimoto et al. |
| 7,732,819 B2 | 6/2010 | Akimoto et al. |
| 7,884,364 B2 | 2/2011 | Kim et al. |
| 7,910,490 B2 | 3/2011 | Akimoto et al. |
| 7,923,726 B2 | 4/2011 | Na et al. |
| 7,932,521 B2 | 4/2011 | Akimoto et al. |
| 7,982,216 B2 | 7/2011 | Imai |
| 8,023,057 B2 | 9/2011 | Kim |
| 8,134,156 B2 | 3/2012 | Akimoto |
| 8,158,464 B2 | 4/2012 | Akimoto |
| 8,274,077 B2 | 9/2012 | Akimoto et al. |
| 8,349,671 B2 | 1/2013 | Miyairi et al. |
| 8,368,079 B2 | 2/2013 | Akimoto |
| 8,436,350 B2 | 5/2013 | Yamazaki et al. |
| 8,466,463 B2 | 6/2013 | Akimoto et al. |
| 8,501,554 B2 | 8/2013 | Miyairi et al. |
| 8,525,165 B2 | 9/2013 | Akimoto |
| 8,537,297 B2 | 9/2013 | Yamaguchi et al. |
| 8,603,866 B2 | 12/2013 | Kim et al. |
| 8,629,069 B2 | 1/2014 | Akimoto et al. |
| 8,669,550 B2 | 3/2014 | Akimoto et al. |
| 8,703,560 B2 | 4/2014 | Miyairi et al. |
| 8,790,959 B2 | 7/2014 | Akimoto et al. |
| 8,796,069 B2 | 8/2014 | Akimoto et al. |
| 8,797,487 B2* | 8/2014 | Koyama ........... G02F 1/136213 349/140 |
| 9,007,542 B2 | 4/2015 | Yamaguchi et al. |
| 10,170,500 B2* | 1/2019 | Koyama ........... H01L 27/1288 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228821 A1 | 10/2006 | Hong et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0153151 A1 | 7/2007 | Yang |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0049437 A1 | 2/2008 | Takayama et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0179202 A1 | 7/2009 | Hong et al. |
| 2009/0186445 A1 | 7/2009 | Akimoto |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0006844 A1* | 1/2010 | Kim ................. H01L 27/124 257/59 |
| 2010/0007829 A1 | 1/2010 | Oikawa et al. |
| 2010/0033643 A1 | 2/2010 | Horiuchi et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163865 A1 | 7/2010 | Arai |
| 2010/0188593 A1 | 7/2010 | Yamaguchi et al. |
| 2011/0084265 A1 | 4/2011 | Arasawa et al. |
| 2011/0085104 A1 | 4/2011 | Arasawa et al. |
| 2011/0104851 A1 | 5/2011 | Akimoto et al. |
| 2011/0121290 A1 | 5/2011 | Akimoto et al. |
| 2011/0147757 A1 | 6/2011 | Kim et al. |
| 2011/0186849 A1 | 8/2011 | Na et al. |
| 2012/0052606 A1 | 3/2012 | Yamazaki |
| 2012/0052625 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2061086 A | 5/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-180237 A | 6/1992 |
| JP | 05-203987 A | 8/1993 |
| JP | 05-251705 A | 9/1993 |
| JP | 07-092494 A | 4/1995 |
| JP | 08-264794 A | 10/1996 |
| JP | 09-092833 A | 4/1997 |
| JP | 09-236827 A | 9/1997 |
| JP | 11-133455 A | 5/1999 |
| JP | 11-505377 | 5/1999 |
| JP | 2000-044236 A | 2/2000 |
| JP | 2000-111958 A | 4/2000 |
| JP | 2000-150900 A | 5/2000 |
| JP | 2000-267140 A | 9/2000 |
| JP | 2001-125139 A | 5/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-273614 A | 9/2004 |
| JP | 2004-273732 A | 9/2004 |
| JP | 2005-302808 A | 10/2005 |
| JP | 2007-123861 A | 5/2007 |
| JP | 2007-165861 A | 6/2007 |
| JP | 2010-170057 A | 8/2010 |
| KR | 2000-0022726 A | 4/2000 |
| KR | 2000-0071454 A | 11/2000 |
| KR | 2001-0068662 A | 7/2001 |
| KR | 2002-0064785 A | 8/2002 |
| KR | 2002-0065333 A | 8/2002 |
| KR | 2005-0111487 A | 11/2005 |
| KR | 2006-0088944 A | 8/2006 |
| KR | 2007-0068768 A | 7/2007 |
| KR | 2008-0054338 A | 6/2008 |
| KR | 2009-0024092 A | 3/2009 |
| KR | 2009-0050970 A | 5/2009 |
| KR | 2010-0088565 A | 8/2010 |
| TW | 578028 | 3/2004 |
| TW | I304621 | 12/2008 |
| WO | WO-2004/114391 | 12/2004 |
| WO | WO-2007/058329 | 5/2007 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM '05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display" SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Korean Office Action (Application No. 2011-0091974) dated Jul. 25, 2018.

\* cited by examiner

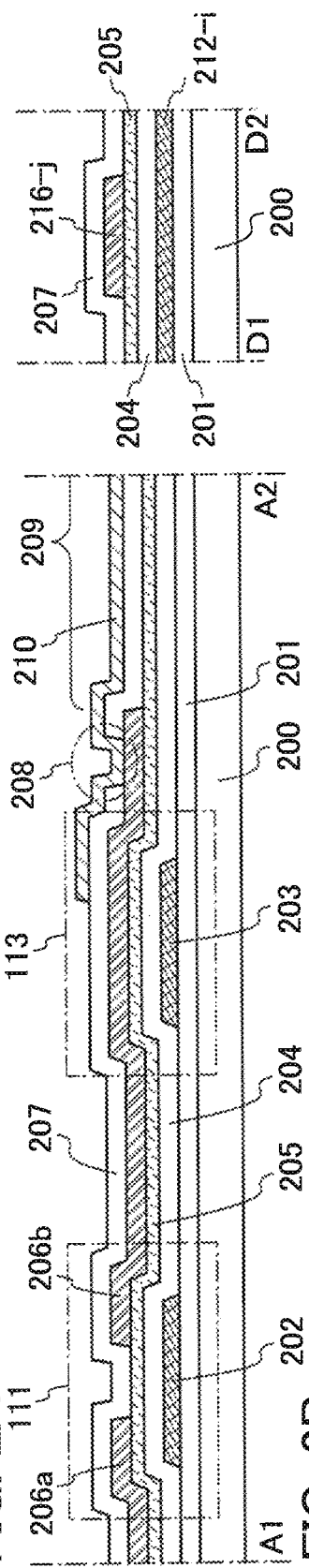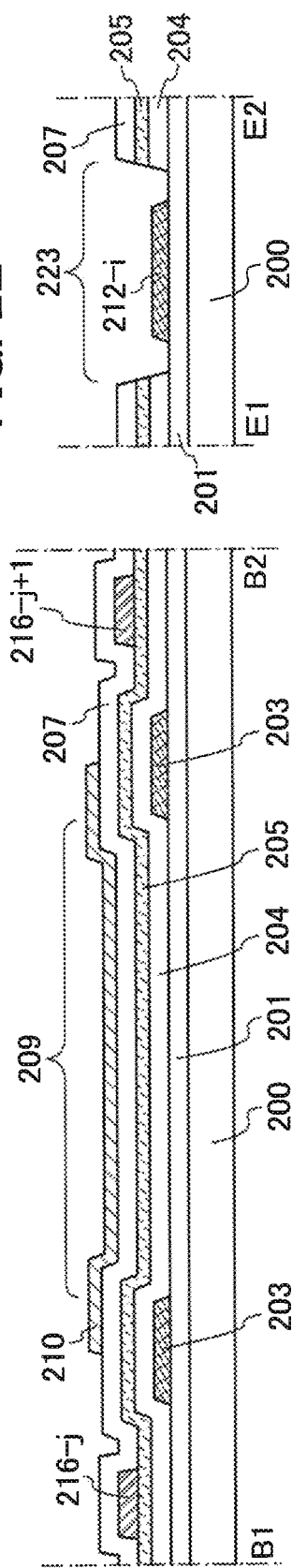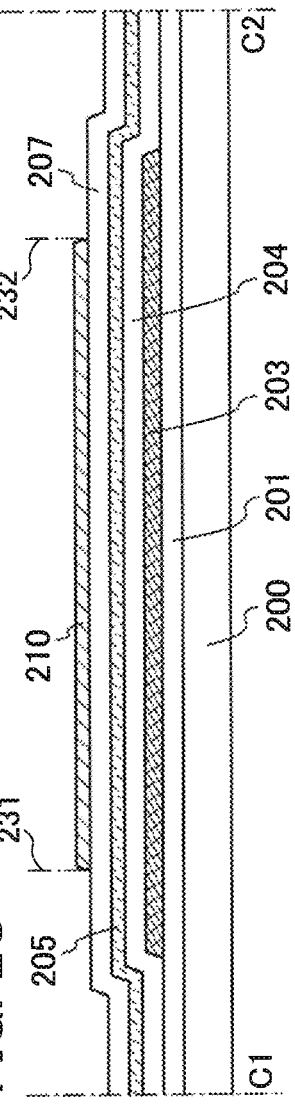

FIG. 8A1
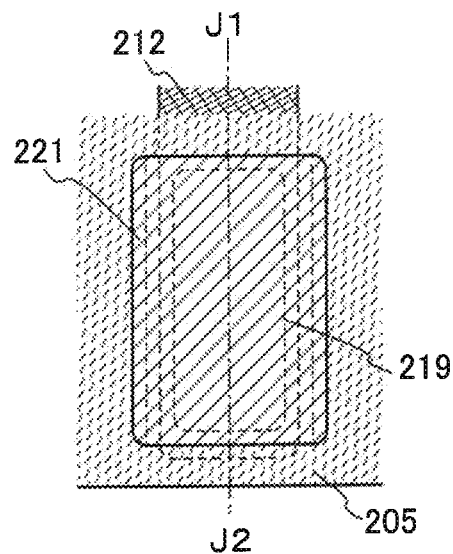
FIG. 8A2
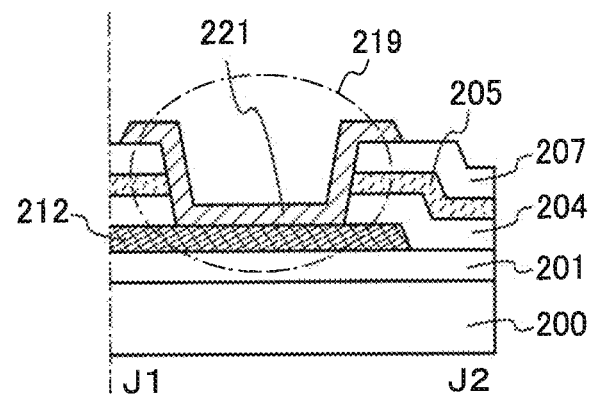
FIG. 8B1
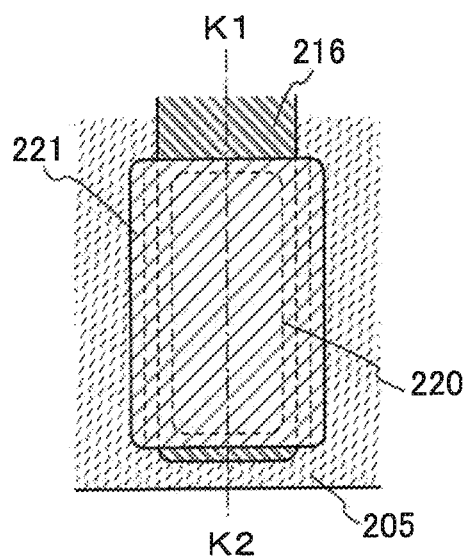
FIG. 8B2
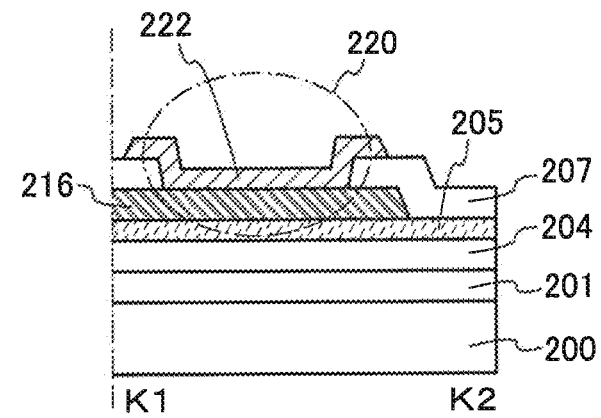

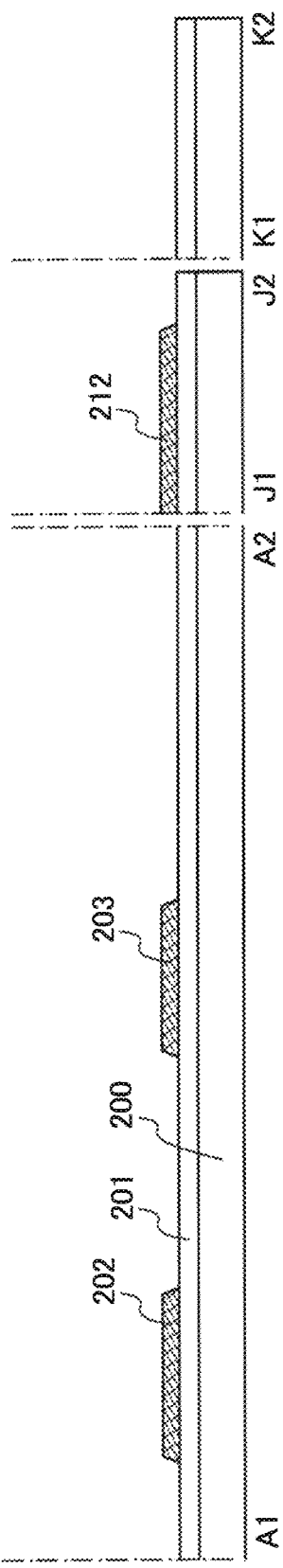
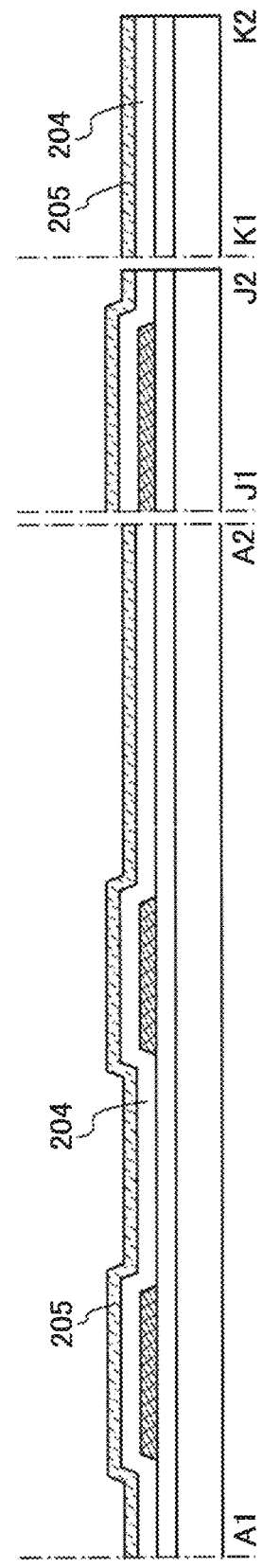
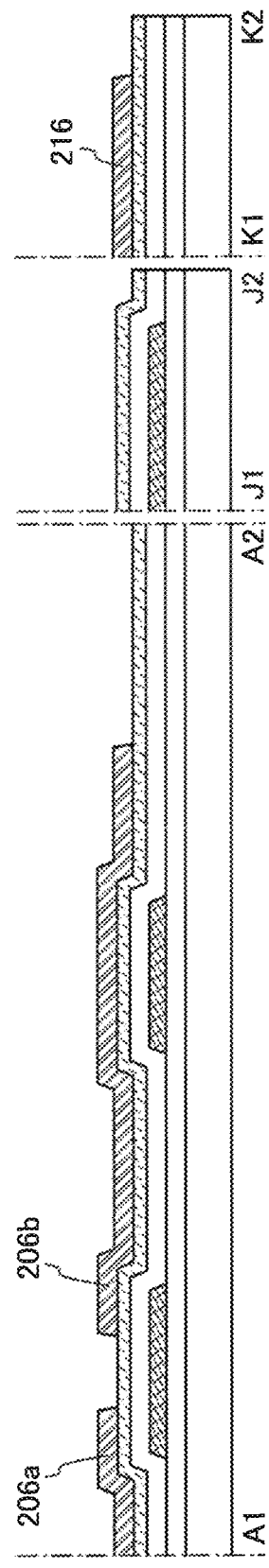

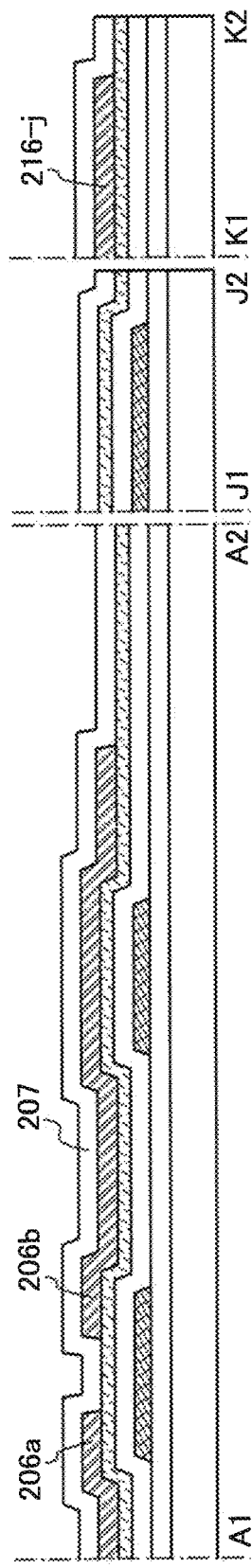
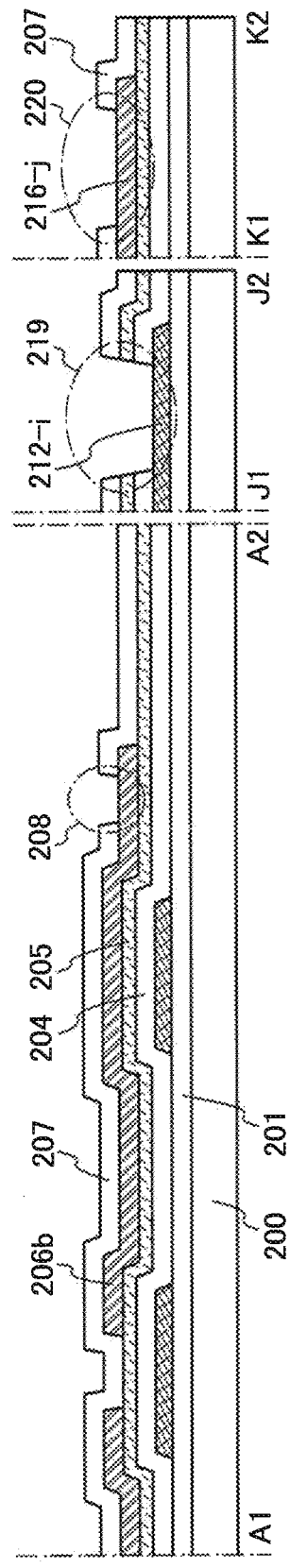
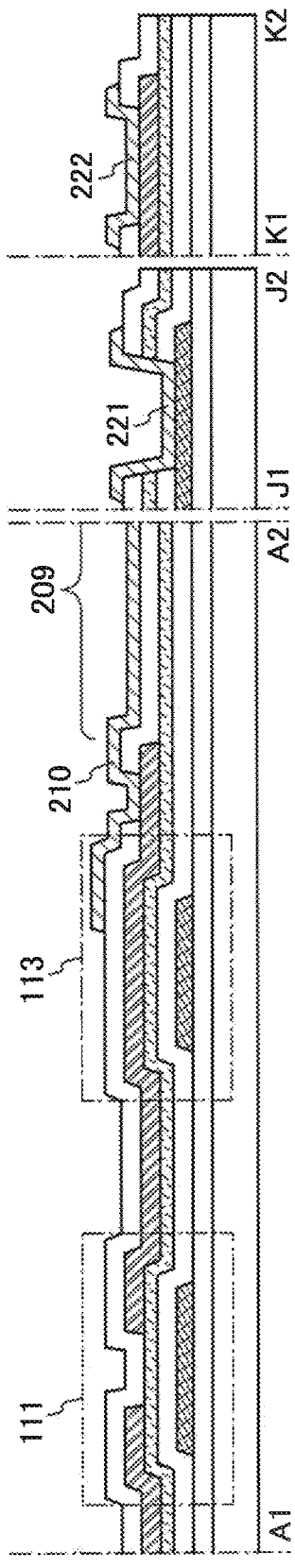

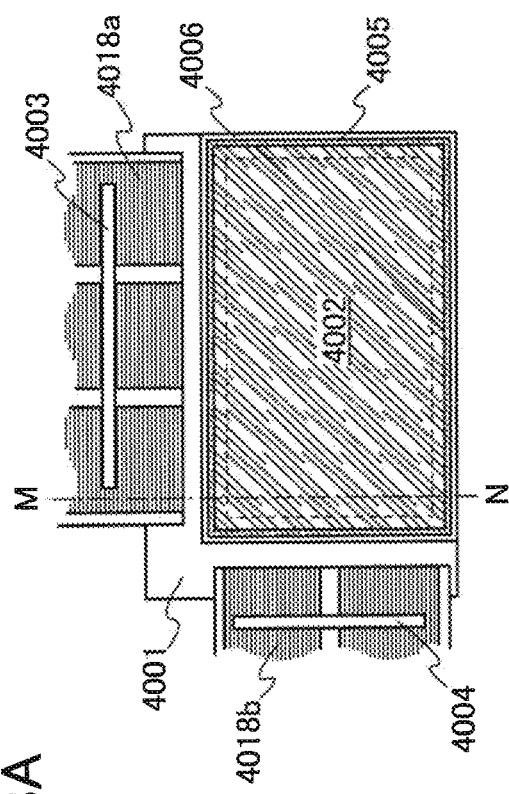
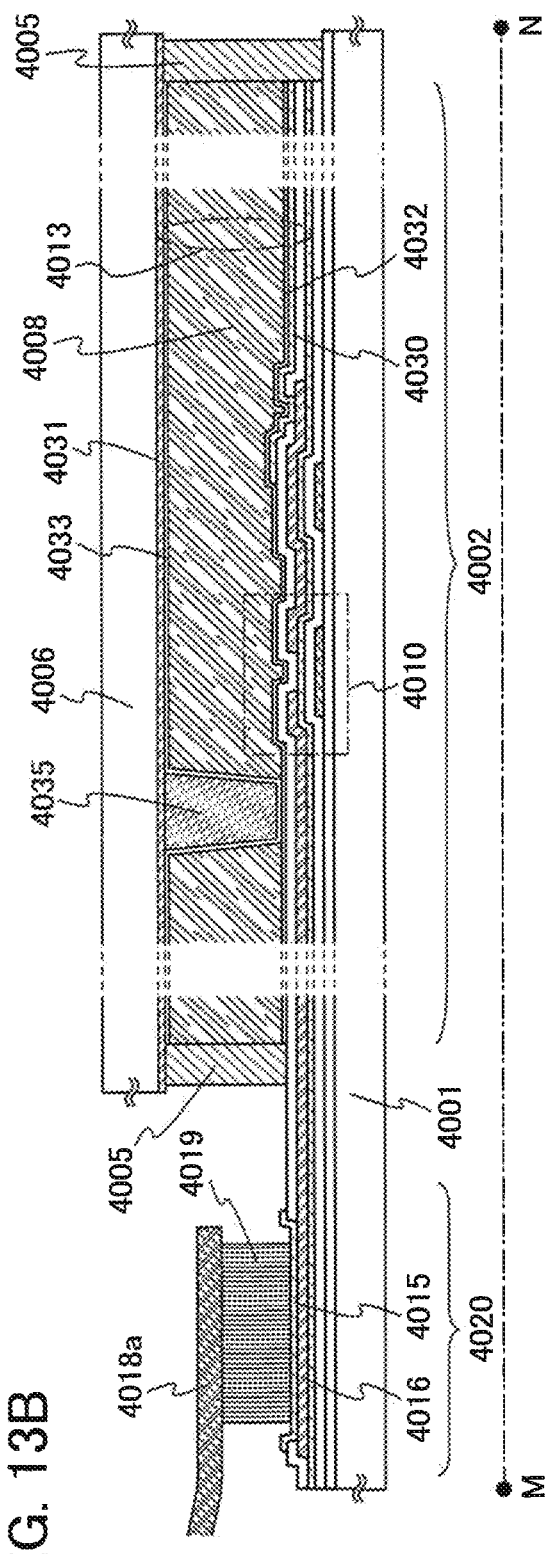
FIG. 13A
FIG. 13B

FIG. 17A
FIG. 17B
FIG. 17C
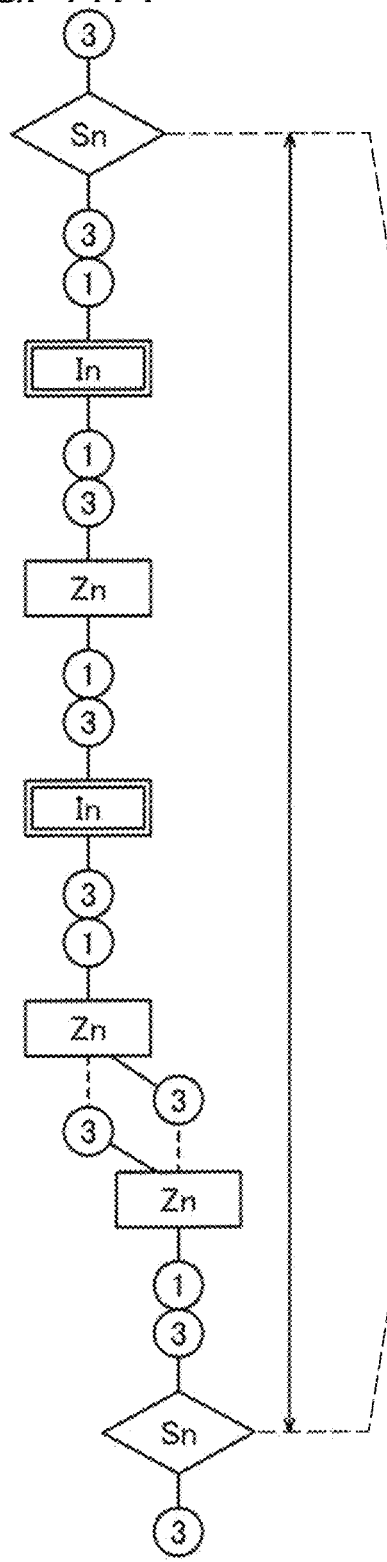
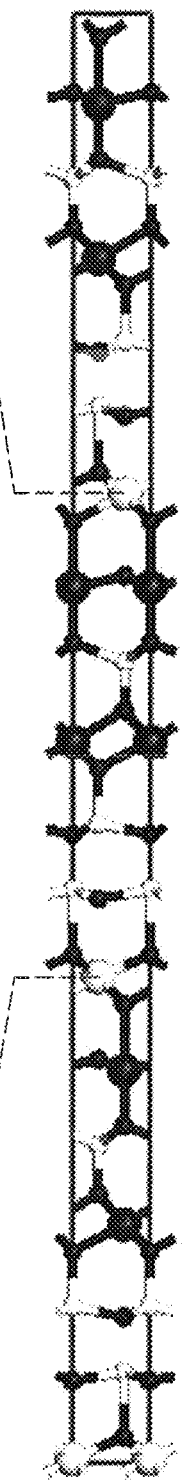
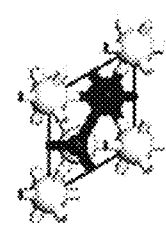
● In
○ Sn
◌ Zn
• O

● In
○ Ga
○ Zn
● O

• In
◐ Ga or Zn
• O

• In
◐ Ga
◐ Zn
• O

TRANSISTOR, LIQUID CRYSTAL DISPLAY DEVICE, AND MANUFACTURING METHOD THEREOF

CROSS-REFERENCE TO RELATED APPLICATIONS

This application is a continuation of U.S. application Ser. No. 15/284,658, filed Oct. 4, 2016, now allowed, which is a continuation of U.S. application Ser. No. 14/338,380, filed Jul. 23, 2014, now U.S. Pat. No. 9,490,350, which is a divisional of U.S. application Ser. No. 13/226,812, filed Sep. 7, 2011, now U.S. Pat. No. 8,797,487, which claims the benefit of a foreign priority application filed in Japan as Serial No. 2010-203356 on Sep. 10, 2010, all of which are incorporated by reference.

BACKGROUND OF THE INVENTION

1. Field of the Invention

An embodiment of the present invention relates to a transistor, a liquid crystal display device, and manufacturing methods of the transistor and the liquid crystal display device.

In this specification, a semiconductor device means all types of devices that can function by utilizing semiconductor characteristics, and a semiconductor circuit, a storage device, an imaging device, a display device, an electro-optical device, an electronic device, and the like are all semiconductor devices.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as ICs (integrated circuits) and electro-optical devices. In particular, transistors are urgently developed as switching elements of image display devices typified by liquid crystal display devices and the like. In an active matrix liquid crystal display device, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The range of uses of such an active matrix liquid crystal display device is expanding, and demands for larger screen size, higher definition, and higher aperture ratio are increasing. In addition, it is demanded that the active matrix liquid crystal display device has high reliability and that a production method of the active matrix liquid crystal display device offers high productivity and reduces production cost. Simplification of a process is one way for increasing productivity and reducing production cost.

In active matrix liquid crystal display devices, transistors are mainly used as switching elements. In manufacturing transistors, reduction in the number of photolithography steps or simplification of the photolithography step is important for simplification of the whole process. For example, when one photolithography step is added, the following steps are further needed: resist application, prebaking, light exposure, development, postbaking, and the like and, moreover, steps before and after the aforementioned steps, such as film formation, etching, resist removal, cleaning, drying, and the like. Therefore, the number of steps is significantly increased only by adding one photolithography step in the manufacturing process. Accordingly, many techniques for reducing the number of photolithography steps or simplifying the photolithography step in the manufacturing process have been developed.

Transistors are broadly classified into top-gate transistors, in which a channel formation region is provided below a gate electrode, and bottom-gate transistors, in which a channel formation region is provided above a gate electrode. These transistors are generally manufactured using at least five photomasks.

Many conventional techniques for simplifying the photolithography step use a complicated technique such as backside light exposure, resist reflow, or a lift-off method, which requires a special apparatus in many cases. Using such complicated techniques may cause various problems, thereby leading to reduction in yield. Moreover, there has often been no option but to sacrifice electric characteristics of transistors.

As typical means for simplifying the photolithography step in the manufacturing process of a transistor, a technique using a multi-tone mask (called a half-tone mask or a gray-tone mask) is widely known. As a technique for reducing the number of manufacturing steps by using a multi-tone mask, Patent Document 1 can be, for example, given.

REFERENCE

Patent Document

[Patent Document 1] Japanese Published Patent Application No. 2003-179069

SUMMARY OF THE INVENTION

It is an object of an embodiment of the present invention to reduce the number of photolithography steps used for manufacturing a transistor to less than the conventional one.

It is an object of an embodiment of the present invention to provide a liquid crystal display device at low cost with high productivity.

It is an object of an embodiment of the present invention to reduce the number of photomasks used for manufacturing a display device including a transistor to less than the conventional one.

It is an object to provide a liquid crystal display device with reduced power consumption.

It is an object to provide a liquid crystal display device with high reliability.

A step for forming an island-shaped semiconductor layer is omitted, and a semiconductor device is manufactured with four photolithography steps: a step of forming a gate electrode (including a wiring formed using the same layer as the gate electrode), a step of forming a source electrode and a drain electrode (including a wiring formed using the same layer as the source electrode and the drain electrode), a step of forming a contact hole (including the removal of an insulating layer and the like in a region other than the contact hole), and a step of forming a pixel electrode (including a wiring formed using the same layer as the pixel electrode).

In order to prevent an influence of a parasitic transistor (a parasitic channel) that is formed, at least part of a wiring that is electrically connected to a gate electrode is provided with a region which extends beyond both end portions of the wiring in the line width direction and overlaps with the wiring, and a semiconductor layer in a portion which overlaps with the region is removed in formation of a contact hole. In addition, part of a capacitor wiring extends along a wiring to which an image signal from the outside is supplied and a potential of the capacitor wiring is set to a potential that is lower than a potential supplied to a pixel electrode.

An embodiment of the present invention is a liquid crystal display device including: a transistor including a gate electrode, a source electrode, a drain electrode, and a semiconductor layer; a first wiring electrically connected to the gate electrode; a second wiring electrically connected to the source electrode; a pixel electrode electrically connected to the drain electrode; and a capacitor wiring. The semiconductor layer overlaps with the first wiring, the second wiring, the pixel electrode, and the capacitor wiring, and part of the capacitor wiring extends beyond an end portion of the pixel electrode in a direction parallel to a direction in which the second wiring extends.

In addition, the capacitor wiring may include an extending portion along the second wiring, and the extending portion may extend beyond the end portion of the pixel electrode in the direction parallel to the direction in which the second wiring extends.

In addition, the extending portion is not necessarily provided in parallel with the second wiring and may have a bent portion or a curved portion.

In addition, the extending portion of the capacitor wiring may overlap with part of the pixel electrode. When the capacitor wiring and the pixel electrode overlap with each other, the overlapping portion can serve as a storage capacitor.

In addition, at least part of the first wiring includes a region extending beyond both end portions of the first wiring in the line width direction, and the semiconductor layer does not exist in the region.

In addition, an embodiment of the present invention is a method for manufacturing a liquid crystal display device, including the steps of: forming a gate electrode, a first wiring electrically connected to the gate electrode, and a capacitor wiring over a substrate by a first photolithography step; forming a gate insulating layer over the gate electrode, the first wiring, and the capacitor wiring; forming a semiconductor layer over the gate insulating layer; forming a source electrode and a drain electrode over the semiconductor layer by a second photolithography step; forming an insulating layer over the source electrode and the drain electrode; forming a contact hole by selectively removing part of the insulating layer overlapping with the drain electrode and removing part of the semiconductor layer over the first wiring, by a third photolithography step; and forming a pixel electrode over the insulating layer by a fourth photolithography step.

An insulating layer having a function of preventing diffusion of impurity elements from the substrate may be provided between the substrate and the gate electrode.

According to an embodiment of the present invention, a first insulating layer is formed over a substrate, a first electrode is formed over the first insulating layer, a second insulating layer is formed over the first electrode, a semiconductor layer is formed over the second insulating layer, a third electrode and a fourth electrode are formed over the semiconductor layer, and a third insulating layer is formed to cover the third electrode and the fourth electrode. Formation of a contact hole by removing part of the third insulating layer which overlaps with the third electrode or the fourth electrode and removal of part of the third insulating layer, part of the semiconductor layer, and part of the second insulating layer are performed in the same step.

The second insulating layer serves as a gate insulating layer, and the third insulating layer serves as a protective insulating layer. The first electrode serves as a gate electrode, the third electrode serves as one of a source electrode and a drain electrode, and the fourth electrode serves as the other of the source electrode and the drain electrode.

The formation of the contact hole and the removal of part of the third insulating layer, part of the semiconductor layer, and part of the second insulating layer can be performed by dry etching, wet etching, or a combination thereof.

When the gate electrode, the source electrode, the drain electrode, or a wiring connected to such electrodes are formed of a material containing copper or aluminum, wiring resistance can be reduced and thus signal delay can be prevented.

Using an oxide semiconductor for the semiconductor layer can realize a liquid crystal display device with low power consumption and high reliability.

Note that an oxide semiconductor which is highly purified (purified OS) by reducing an impurity such as moisture or hydrogen serving as an electron donor can be made to be an i-type (intrinsic) oxide semiconductor or an oxide semiconductor extremely close to an i-type oxide semiconductor (a substantially i-type oxide semiconductor) by being supplied with oxygen to reduce oxygen deficiency in the oxide semiconductor. A transistor including the i-type or substantially i-type oxide semiconductor has a characteristic of extremely small off-state current. Specifically, the concentration of hydrogen in the highly purified oxide semiconductor which is measured by secondary ion mass spectrometry (SIMS) is lower than or equal to $5\times10^{19}/cm^3$, preferably lower than or equal to $5\times10^{18}/cm^3$, more preferably lower than or equal to $5\times10^{17}/cm^3$, still more preferably lower than or equal to $1\times10^{16}/cm^3$.

In addition, the carrier density of the i-type or substantially i-type oxide semiconductor, which is measured by Hall effect measurement, is lower than $1\times10^{14}/cm^3$, preferably lower than $1\times10^{12}/cm^3$, more preferably lower than $1\times10^{11}/cm^3$. Furthermore, the band gap of the oxide semiconductor is greater than or equal to 2 eV, preferably greater than or equal to 2.5 eV, more preferably greater than or equal to 3 eV. The transistor including the i-type or substantially i-type oxide semiconductor can have small off-state current.

The analysis of the hydrogen concentration in the oxide semiconductor by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a maximum value peak and a minimum value valley do not exist in the region where the film is provided, the value of the inflection point is employed as the hydrogen concentration.

According to an embodiment of the present invention, the number of manufacturing steps of a liquid crystal display device can be reduced; accordingly, a liquid crystal display device can be provided at low cost with high productivity.

A liquid crystal display device with low power consumption and high reliability can be provided. An embodiment of the present invention can achieve at least one of the above objects.

BRIEF DESCRIPTION OF THE DRAWINGS

FIGS. 2A to 2E are cross-sectional views illustrating an embodiment of the present invention.

FIGS. 8A1 and 8B1 are top views and FIGS. 8A2 and 8B2 are cross-sectional views, illustrating an embodiment of the present invention.

FIGS. 10A to 10C are cross-sectional views illustrating an embodiment of the present invention.

FIGS. 11A to 11C are cross-sectional views illustrating an embodiment of the present invention.

FIG. 13A is a top view and FIG. 13B is a cross-sectional view, illustrating an embodiment of the present invention.

FIGS. 17A to 17C are views illustrating a crystal structure of an oxide material.

DETAILED DESCRIPTION OF THE INVENTION

Figure 1:
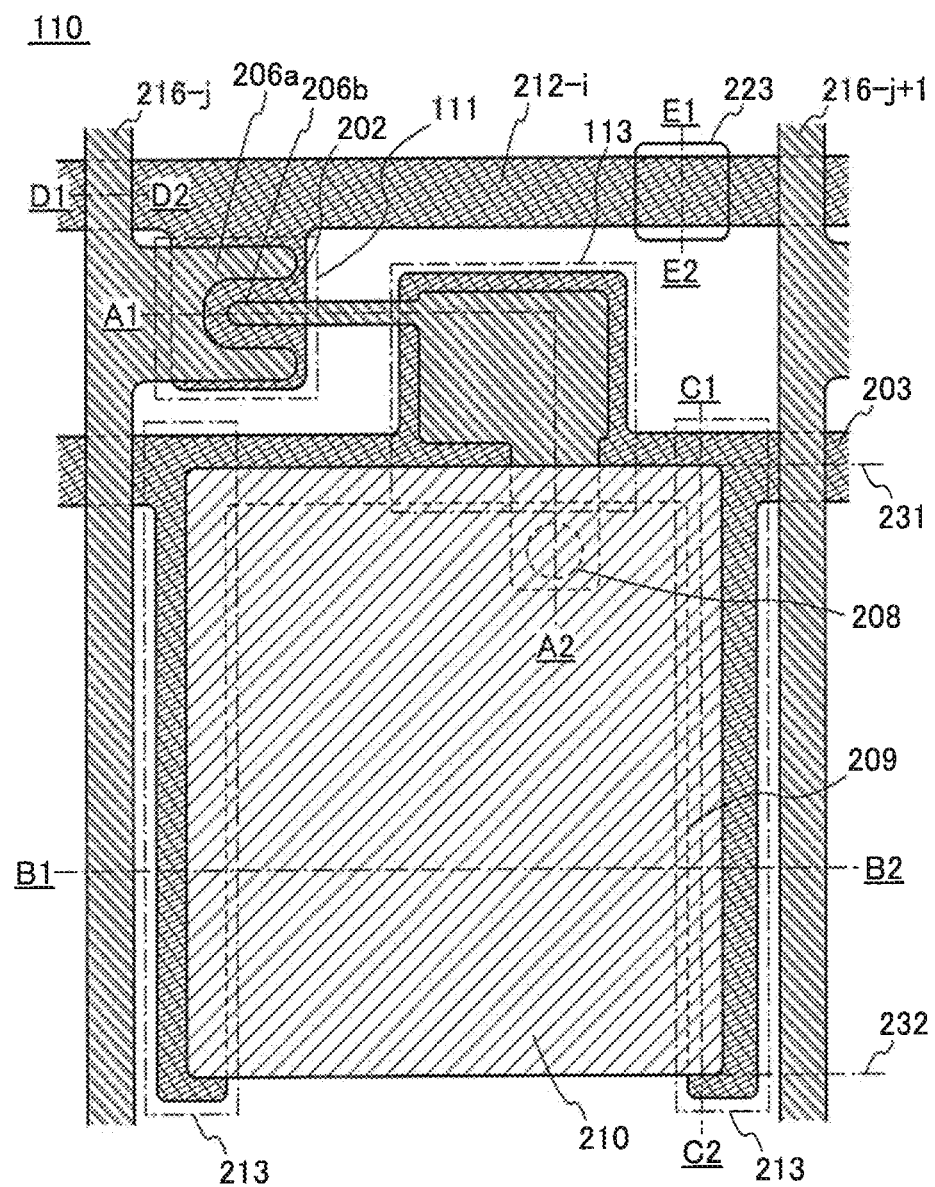
FIG. 1 is a top view illustrating an embodiment of the present invention.

Embodiments will be described with reference to the drawings. Note that the present invention is not limited to the following description, and it will be readily appreciated by those skilled in the art that the mode and details can be changed in various ways without departing from the spirit and the scope of the present invention. Therefore, the present invention should not be construed as being limited to the following description of the embodiments. Note that in the structure of the present invention described below, the same reference numerals are commonly used to denote the same components or components having similar functions among different drawings, and description of such components is not repeated.

In addition, in this specification and the like, ordinal numbers such as "first", "second", and "third" are used in order to avoid confusion among components, and the terms do not limit the components numerically.

In addition, the position, size, range, or the like of each structure illustrated in drawings and the like is not accurately represented in some cases for easy understanding. Therefore, the disclosed invention is not necessarily limited to the position, size, range, or the like as disclosed in the drawings and the like.

A transistor is one kind of semiconductor elements and can amplify current or voltage and perform a switching operation for controlling conduction or non-conduction, for example A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example Therefore, the terms "source" and "drain" can also be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings" formed in an integrated manner.

Embodiment 1

In this embodiment, examples of a pixel structure of a liquid crystal display device formed through a process in which the number of photomasks and the number of photolithography steps are reduced, and an example of a method for forming the pixel structure will be described with reference to FIG. 1, FIGS. 2A to 2E, FIGS. 3A and 3B, FIGS. 4A and 4B, FIGS. 5A and 5B, FIGS. 6A and 6B, FIG. 7, FIGS. 8A1 to 8B2, FIGS. 9A and 9B, FIGS. 10A to 10C, and FIGS. 11A to 11C.

Figure 5A:
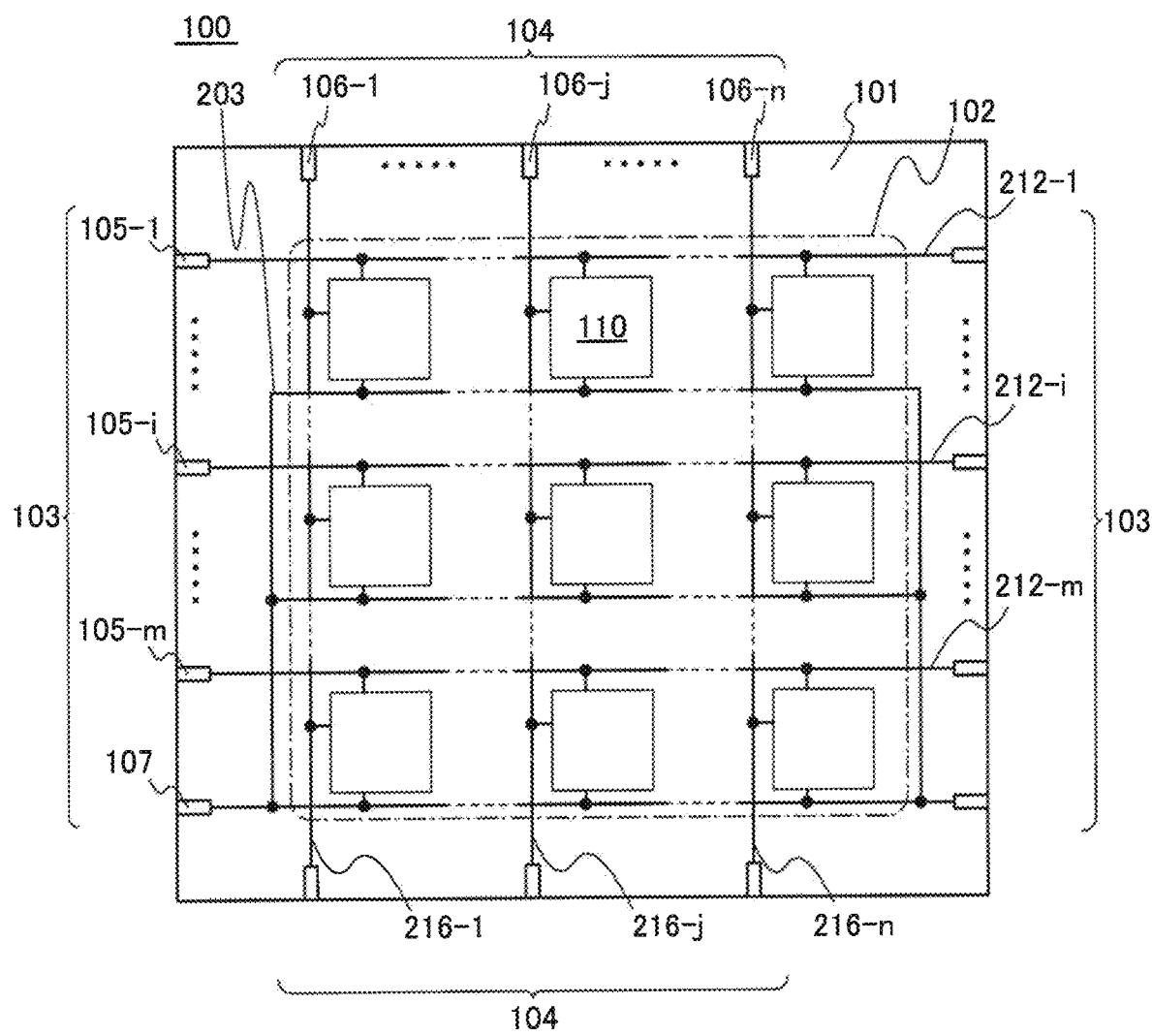
FIGS. 5A and 5B are circuit diagrams, illustrating an embodiment of the present invention.

FIG. 5A illustrates an example of the structure of a semiconductor device 100 that is used in a liquid crystal display device. The semiconductor device 100 includes a pixel region 102, a terminal portion 103 including m terminals 105 (m is an integer of greater than or equal to 1), and a terminal portion 104 including n terminals 106 (n is an integer of greater than or equal to 1) over a substrate 101. Further, the semiconductor device 100 includes m wirings 212 electrically connected to the terminal portion 103 and n wirings 216 electrically connected to the terminal portion 104. The pixel region 102 includes a plurality of pixels 110 arranged in a matrix of m (rows) and n (columns). A pixel 110(i,j) in the i-th row and the j-th column (i is an integer of greater than or equal to 1 and less than or equal to m, and j is an integer of greater than or equal to 1 and less than or equal to n) is electrically connected to a wiring 212-i and a wiring 216-j. In addition, each pixel is electrically connected to the wiring 203 serving as a capacitor electrode or a capacitor wiring, and the wiring 203 is electrically connected to the terminal 107. The wiring 212-i is electrically connected to a terminal 105-i, and the wiring 216-j is electrically connected to a terminal 106-j.

The terminal portion 103 and the terminal portion 104 are external input terminals and are connected to external control circuits with flexible printed circuits (FPC) or the like. A signal supplied from the external control circuit is input to the semiconductor device 100 through the terminal portion 103 or the terminal portion 104. In FIG. 5A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance accompanied by an increase in definition can be reduced. Moreover, the semiconductor device 100 can have redundancy, so that reliability of the semiconductor device 100 can be improved. Although two terminal portions 103 and two terminal portions 104 are provided in FIG. 5A, a structure in which one terminal portion 103 and one terminal portion 104 are provided may also be employed.

Figure 5B:
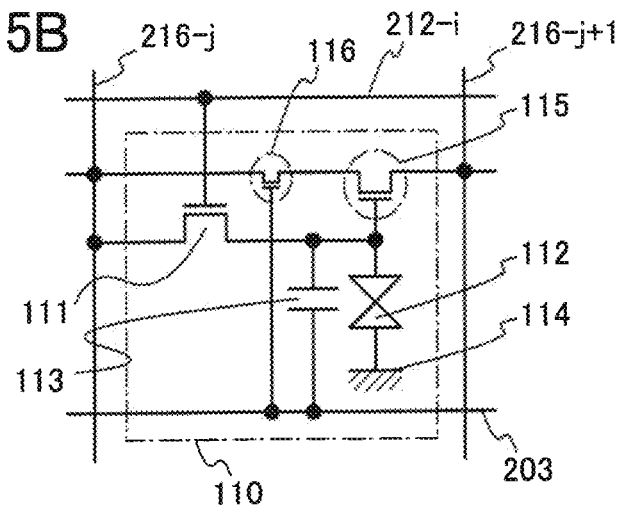

FIG. 5B illustrates a circuit structure of the pixel 110. The pixel 110 includes a transistor 111, a liquid crystal element 112, and a capacitor 113. A gate electrode of the transistor 111 is electrically connected to the wiring 212-$i$, and one of a source electrode and a drain electrode of the transistor 111 is electrically connected to the wiring 216-$j$. The other of the source electrode and the drain electrode of the transistor 111 is electrically connected to one electrode of the liquid crystal element 112 and one electrode of the capacitor 113. The other electrode of the liquid crystal element 112 is electrically connected to an electrode 114. The potential of the electrode 114 may be a fixed potential such as 0 V, GND, or a common potential. The other electrode of the capacitor 113 is electrically connected to the wiring 203.

The transistor 111 has a function of selecting whether an image signal supplied from the wiring 216-$j$ is input to the liquid crystal element 112. After a signal that turns on the transistor 111 is supplied to the wiring 212-$i$, an image signal is supplied to the liquid crystal element 112 from the wiring 216-$j$ through the transistor 111. The transmittance of light is controlled in accordance with the image signal (potential) supplied to the liquid crystal element 112. The capacitor 113 has a function as a storage capacitor (also referred to as a Cs capacitor) for holding a potential supplied to the liquid crystal element 112. The capacitor 113 is not always needed to be provided; however, in the case of providing the capacitor 113, variation in the potential applied to the liquid crystal element 112, which is caused by a current flowing between a source electrode and a drain electrode in an off state of the transistor 111 (off-state current), can be suppressed.

In the pixel 110 disclosed in this embodiment, a parasitic transistor 115 is likely to be formed between the wiring 216-$j$ and a wiring 216-$j$+1, and the parasitic transistor 115 might electrically connect the wiring 216-$j$ and the wiring 216-$j$+1. Therefore, a parasitic transistor 116 is formed between the wiring 216-$j$ and the wiring 216-$j$+1, and the parasitic transistor 116 is constantly kept in an off state, which prevents electrical connection between the wiring 216-$j$ and the wiring 216-$j$+1.

As a semiconductor layer in which a channel of the transistor 111 is formed, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide.

The display device described in this embodiment has a structure in which the semiconductor layer remains in the pixel region; thus, in the case where the display device including the semiconductor layer is used for a transmissive display device, the transmittance of visible light is preferably increased by, for example, thinning the semiconductor layer as much as possible.

In addition, an oxide semiconductor can be used for the semiconductor layer in which a channel of the transistor 111 is formed. An oxide semiconductor has an energy gap that is as wide as greater than or equal to 3.0 eV, and thus has high transmittance with respect to visible light. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, the potential applied to the liquid crystal element 112 can be held without provision of the capacitor 113. In addition, in terms of realizing a liquid crystal display device with low power consumption, it is preferable to use an oxide semiconductor layer for the semiconductor layer in which the channel of the transistor 111 is formed.

Next, an example of the structure of the pixel 110 illustrated in FIGS. 5A and 5B will be described with reference to FIG. 1 and FIGS. 2A to 2E. FIG. 1 is a top view illustrating a planar structure of the pixel 110, and FIGS. 2A to 2E are cross-sectional views each illustrating a layered structure of the pixel 110. Note that chain lines A1-A2, B1-B2, C1-C2, D1-D2, and E1-E2 in FIG. 1 correspond to cross sections A1-A2, B1-B2, C1-C2, D1-D2, and E1-E2 in FIGS. 2A to 2E, respectively.

In the transistor 111 in this embodiment, a drain electrode 206$b$ is surrounded by a source electrode 206$a$ that is U-shaped (or C-shaped, U-shaped with square corners, or horseshoe-shaped). With such a shape, an enough channel width can be ensured even when the area of the transistor is small, and accordingly, the amount of current flowing at the time of conduction of the transistor (also referred to as the on-state current) can be increased.

If parasitic capacitance generated between a gate electrode 202 and the drain electrode 206$b$ electrically connected to a pixel electrode 210 is large, the transistor is easily influenced by feedthrough, which may cause degradation in display quality because the potential supplied to the liquid crystal element 112 cannot be held accurately. With the structure in which the source electrode 206$a$ is U-shaped and surrounds the drain electrode 206$b$ as described in this embodiment, an enough channel width can be ensured and parasitic capacitance generated between the drain electrode 206$b$ and the gate electrode 202 can be reduced. Therefore, the display quality of a liquid crystal display device can be improved.

The wiring 203 serves as a capacitor electrode or a capacitor wiring. Part of the wiring 203 includes an extending portion 213 along the wiring 216-$j$ or the wiring 216-$j$+1, and the extending portion 213 overlaps with part of the pixel electrode 210. The extending portion 213 is provided to extend beyond an end portion 231 and an end portion 232 of the pixel electrode 210.

In the pixel electrode 210, an opening 209 is a region which contributes to image display by transmitting light from a backlight in a transmissive liquid crystal display device or by reflecting incident light serving as a light source in a reflective liquid crystal display device. In the case where the semiconductor device described in this embodiment is used for a transmissive liquid crystal display device, the opening 209 corresponds to a region where the pixel electrode 210 overlaps with a region that is on the inner side than a dashed line denoted by reference numeral 209.

In addition, a region 223 is provided over part of the wiring 212-$i$. The region 223 is provided over the wiring 212-$i$ so as to extend beyond both end portions of the wiring 212-$i$ in the line width direction. Note that the plurality of regions 223 may be provided over the wiring 212-$i$.

In the cross section A1-A2, layered structures of the transistor 111 and the capacitor 113 are illustrated. The transistor 111 is a bottom gate transistor. In the cross section B1-B2, a layered structure from the wiring 216-$j$ to the wiring 216-$j$+1, which includes the opening 209, is illustrated. In the cross section D1-D2, a layered structure in a portion where the wiring 216-$j$ and the wiring 212-$i$ cross each other is illustrated. In the cross section E1-E2, a layered structure in the region 223 is illustrated.

In the cross section A1-A2 in FIG. 2A, a base layer 201 is formed over a substrate 200, and the gate electrode 202 and the wiring 203 are formed over the base layer 201. Over the gate electrode 202 and the wiring 203, a gate insulating layer 204 and a semiconductor layer 205 are formed. Over the semiconductor layer 205, the source electrode 206$a$ and the drain electrode 206$b$ are formed. Further, an insulating layer 207 is formed over the source electrode 206$a$ and the drain electrode 206$b$ so as to be in contact with part of the semiconductor layer 205. The pixel electrode 210 is formed over the insulating layer 207 and is electrically connected to the drain electrode 206$b$ through a contact hole 208 formed in the insulating layer 207.

A portion in which the wiring 203 overlaps with the drain electrode 206$b$ with the gate insulating layer 204 and the semiconductor layer 205 interposed therebetween functions as the capacitor 113. The gate insulating layer 204 and the semiconductor layer 205 serve as dielectric layers. In the case where the dielectric layer formed between the wiring 203 and the pixel electrode 210 has a multilayer structure, even if a pinhole is generated in one layer in the dielectric layer, the pinhole is covered with another layer of the dielectric layer and the capacitor 113 can operate normally. The relative dielectric constant of an oxide semiconductor is as high as 14 to 16. Accordingly, when an oxide semiconductor is used for the semiconductor layer 205, the capacitance value of the capacitor 113 can be increased.

In the cross section B1-B2 illustrated in FIG. 2B, the base layer 201 is formed over the substrate 200, and the wiring 203 is formed over the base layer 201. In addition, the gate insulating layer 204 and the semiconductor layer 205 are formed over the wiring 203, and the wiring 216-$j$ and the wiring 216-$j$+1 are formed over the semiconductor layer 205. In addition, the insulating layer 207 is formed over the semiconductor layer 205, the wiring 216-$j$, and the wiring 216-$j$+1. The pixel electrode 210 is formed over the insulating layer 207. Note that the wiring 203 in the cross section B1-B2 corresponds to a cross section of the extending portion 213 of the wiring 203.

In the cross section C1-C2 illustrated in FIG. 2C, the base layer 201 is formed over the substrate 200, and the wiring 203 is formed over the base layer 201. In addition, the gate insulating layer 204 and the semiconductor layer 205 are formed over the wiring 203. The insulating layer 207 is formed over the semiconductor layer 205, and the pixel electrode 210 is formed over the insulating layer 207. Note that the wiring 203 in the cross section C1-C2 corresponds to the extending portion 213 of the wiring 203. In the cross section C1-C2, the wiring 203 is provided to extend beyond the end portion 231 and the end portion 232 of the pixel electrode 210. That is, the extending portion 213 is provided to extend beyond the end portion 231 and the end portion 232 of the pixel electrode 210. Note that the pixel electrode 210 and the wiring 203 including the extending portion 213 are not always needed to overlap with each other; however, when the wiring 203 and the pixel electrode 210 overlap with each other, the overlapping portion can serve as a Cs capacitor.

In the cross section D1-D2 illustrated in FIG. 2D, the base layer 201 is formed over the substrate 200, and the wiring 212-$i$ is formed over the base layer 201. In addition, the gate insulating layer 204 and the semiconductor layer 205 are formed over the wiring 212-$i$. In addition, the wiring 216-$j$ is formed over the semiconductor layer 205, and the insulating layer 207 is formed over the wiring 216-$j$.

In the cross section E1-E2 illustrated in FIG. 2E, the base layer 201 is formed over the substrate 200, and the wiring 212-$i$ is formed over the base layer 201. In the region 223, the gate insulating layer 204, the semiconductor layer 205, and the insulating layer 207 are removed to expose the wiring 212-$i$. The region 223 is formed to prevent formation of a parasitic transistor in which the wiring 212-$i$ serves as a gate electrode in order to prevent electrical connection between the wiring 216-$j$ and the wiring 216-$j$+1. In the region 223, when the semiconductor layer 205 over the wiring 212-$i$ is removed, a parasitic transistor can be prevented from being formed, thereby preventing electrical connection between the wiring 216-$j$ and the wiring 216-$j$+1.

The semiconductor device described in this embodiment has a structure in which the semiconductor layer 205 remains in the entire pixel region because a photolithography step and an etching step for forming an island-shaped semiconductor layer are not performed in order to simplify the manufacturing process. As a result, the parasitic transistor 115 is formed, in which the pixel electrode 210 serves as a gate electrode, the insulating layer 207 serves as a gate insulating layer, the wiring 216-$j$ serves as one of a source electrode and a drain electrode, and the wiring 216-$j$+1 serves as the other of the source electrode and the drain electrode.

The case where the parasitic transistor 115 is as an n-channel transistor is described. When a potential of the wiring 216-$j$ or the wiring 216-$j$+1 is lower than a potential supplied to or held in the pixel electrode 210 and an absolute value of a difference between the potential of the wiring 216-$j$ or the wiring 216-$j$+1 and the potential supplied to or held in the pixel electrode 210 is larger than a threshold voltage of the parasitic transistor 115, carriers are induced in the semiconductor layer 205 below the pixel electrode 210, a parasitic channel is formed, and the parasitic transistor 115 is turned on.

With the parasitic transistor 115 turned on, the wiring 216-$j$ and the wiring 216-$j$+1 are electrically connected to each other. When the wiring 216-$j$ and the wiring 216-$j$+1 are electrically connected to each other through the parasitic transistor 115, image signals from the wiring 216-$j$ and the wiring 216-$j$+1 interfere with each other, so that a correct image signal cannot be supplied to the liquid crystal element 112. Further, when the pixel electrode 210 is provided close to the wiring 216-$j$ or the wiring 216-$j$+1 by, for example, enlarging the opening 209, the influence of the parasitic transistor 115 gets stronger.

Therefore, the wiring 203 is provided with the extending portion 213, and a potential constantly lower than that of an image signal supplied to the liquid crystal element 112 is supplied to the wiring 203. By setting the potential of the wiring 203 constantly lower than that of the image signal, carriers are not induced in the semiconductor layer 205 in a region overlapping with the extending portion 213, and the parasitic channel can be prevented from being formed between the wiring 216-$j$ and the wiring 216-$j$+1. That is, by setting the potential of the extending portion 213 constantly lower than that of the image signal, electrical connection between the wiring 216-$j$ and the wiring 216-$j$+1 can be prevented.

In this embodiment, two extending portions 213 are provided in one pixel, but it is sufficient as long as at least one extending portion 213 is provided between the wiring 216-$j$ and the wiring 216-$j$+1. In addition, the extending portion 213 is not necessarily provided in parallel with the wiring 216-$j$ or the wiring 216-$j$+1 and may have a bent portion or a curved portion. Further, as illustrated in FIG. 1 and FIG. 2C, by providing the extending portion 213 so as to extend beyond the end portion 231 and the end portion 232 of the pixel electrode 210, the influence of the parasitic transistor 115 can be suppressed. That is, the parasitic transistor 116 including the extending portion 213 of the wiring 203, which serves as a gate electrode, between the wiring 216-$j$ and the wiring 216-$j$+1 can be formed. By constantly keeping the parasitic transistor 116 in an off state, electrical connection between the wiring 216-$j$ and the wiring 216-$j$+1 can be prevented.

By removing not only the insulating layer 207 and the semiconductor layer 205 in the region 223 but also those in the opening 209 in a step of forming a contact hole described later, the formation of the parasitic transistor 115 can be prevented. However, when the height of a step portion in the pixel region 102 is increased, disclination due to alignment failure of the liquid crystal element or the like might be caused, resulting in poor image quality. Therefore, it is preferable that the removal of the insulating layer 207 and the semiconductor layer 205 in the pixel region 102, which increases the height of the step portion, be not performed.

Figure 3A:
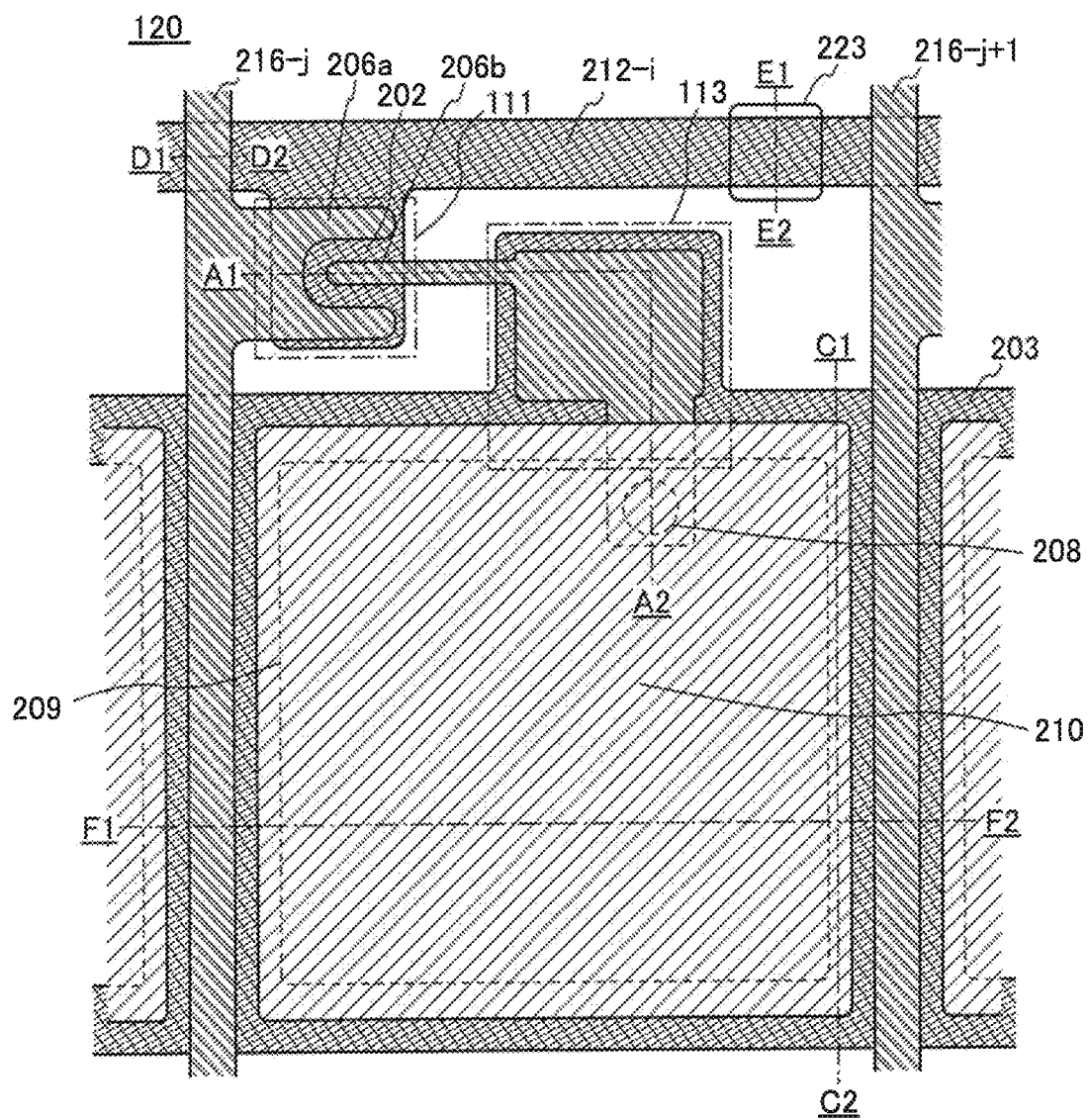
FIG. 3A is a top view and FIG. 3B is a cross-sectional view, illustrating an embodiment of the present invention.
Figure 3B:
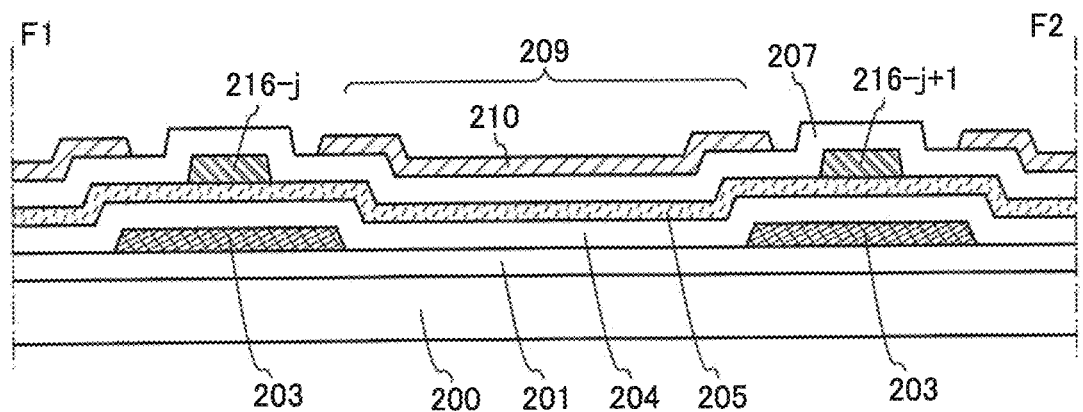

Then, an example of a pixel structure which is different from that illustrated in FIG. 1 will be described with reference to FIGS. 3A and 3B. FIG. 3A is a top view illustrating the planar structure of a pixel 120. A cross section F1-F2 in FIG. 3B corresponds to a cross section along chain line F1-F2 in FIG. 3A. The pixel 120 illustrated in FIGS. 3A and 3B is different from the pixel 110 illustrated in FIG. 1 in the position and the shape of the wiring 203. Note that the structures of cross sections along chain lines A1-A2, B1-B2, C1-C2, D1-D2, and E1-E2 in FIG. 3A are the same as those in FIG. 1 and FIGS. 2A to 2E.

In the pixel 120, the extending portion 213 of the wiring 203 is provided so as to overlap with the wiring 216-$j$, so that the area of the opening 209 is increased. In a portion where the wiring 216-$j$ overlaps with the wiring 203, the line width of the wiring 203 is set larger than the line width of the wiring 216-$j$, and a potential constantly lower than that of an image signal supplied to the liquid crystal element 112 is supplied to the wiring 203. When the line width of the wiring 203 is larger than the line width of the wiring 216-$j$ and the potential of the wiring 203 is constantly lower than that of the image signal, electrical connection between the wiring 216-$j$ and the wiring 216-$j$+1 through the parasitic transistor 115 can be prevented.

In addition, by providing the wiring 203 along the rim of the pixel electrode 210, the wiring 203 can serve as a black matrix.

Figure 4A:
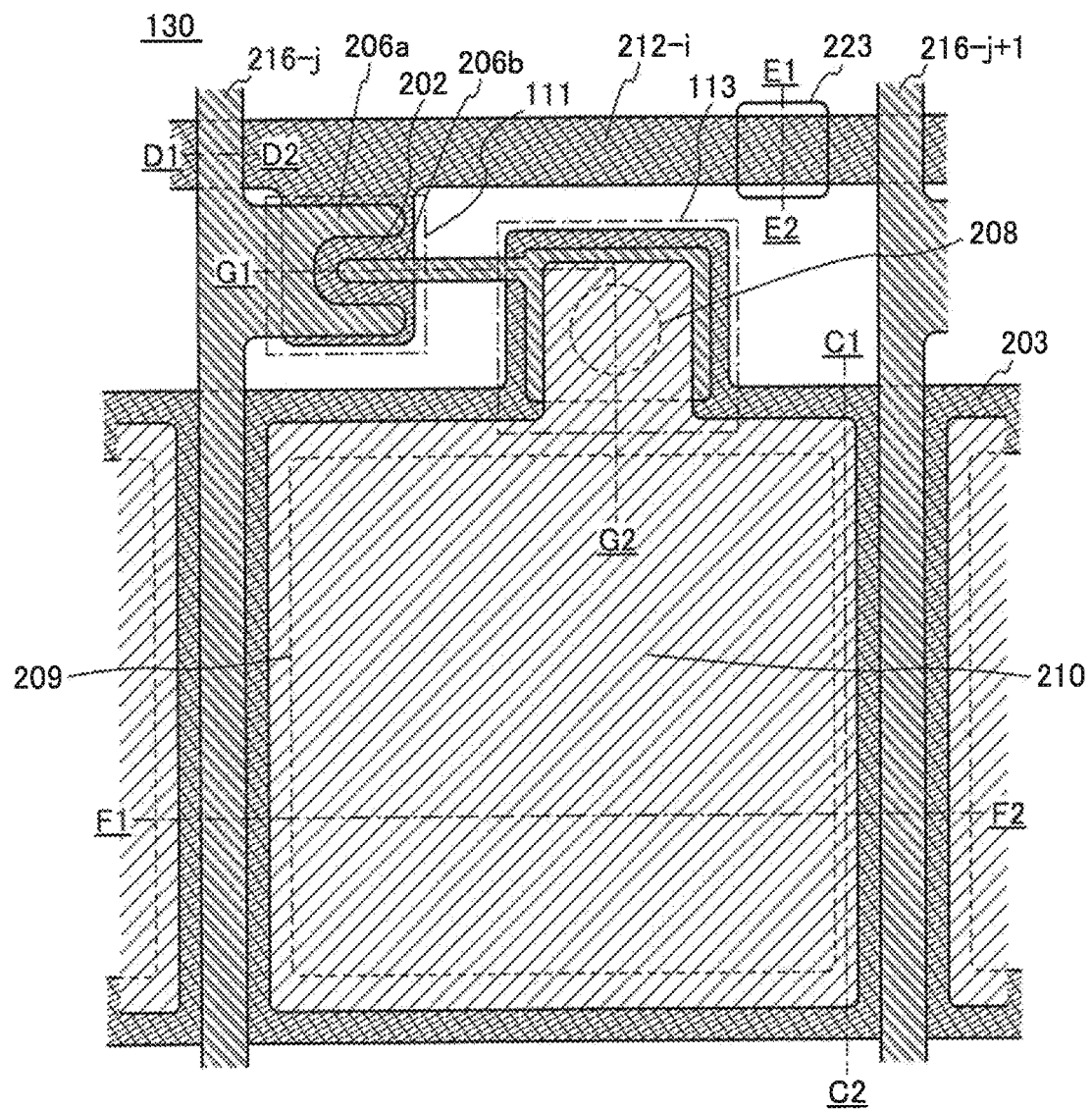
FIG. 4A is a top view and FIG. 4B is a cross-sectional view, illustrating an embodiment of the present invention.
Figure 4B:
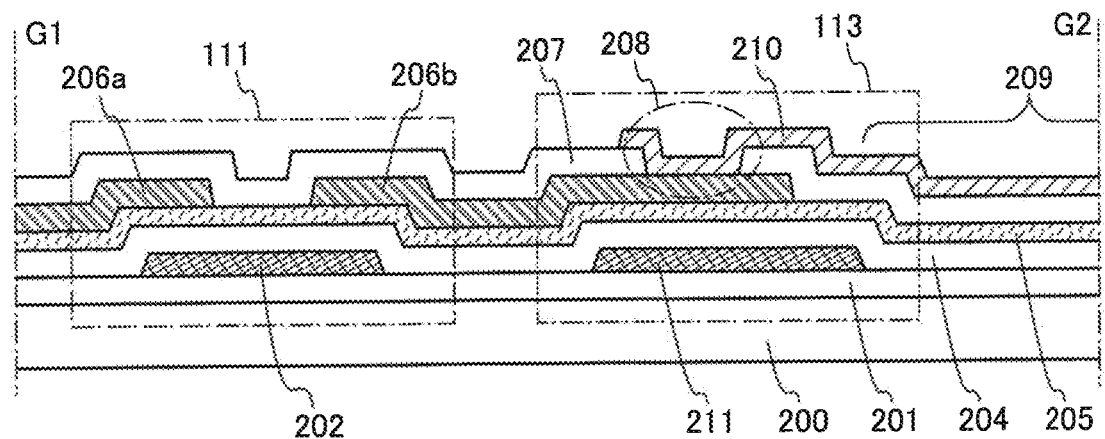

Then, an example of a pixel structure which is different from those in FIG. 1 and FIGS. 3A and 3B will be described with reference to FIGS. 4A and 4B. FIG. 4A is a top view illustrating the planar structure of a pixel 130. A cross section G1-G2 in FIG. 4B corresponds to a cross section along chain line G1-G2 in FIG. 4A. The pixel 130 illustrated in FIGS. 4A and 4B is different from the pixel 120 illustrated in FIGS. 3A and 3B in the position of the contact hole 208 and thus the shapes of the drain electrode 206$b$ and the pixel electrode 210. Note that the structures of cross sections along chain lines C1-C2, D1-D2, E1-E2, and F1-F2 in FIG. 4A are the same as those in FIG. 1, FIGS. 2A to 2E, and FIGS. 3A and 3B.

In the pixel 130, by providing the contact hole 208 directly over the capacitor 113, the drain electrode 206$b$ is downsized and the area of the opening portion 209 is increased. By increasing the area of the opening 209, light from a backlight can be efficiently transmitted, so that a liquid crystal display device which can display a bright and high-quality image can be manufactured. In addition, a liquid crystal display device with low power consumption can be manufactured.

Figure 6A:
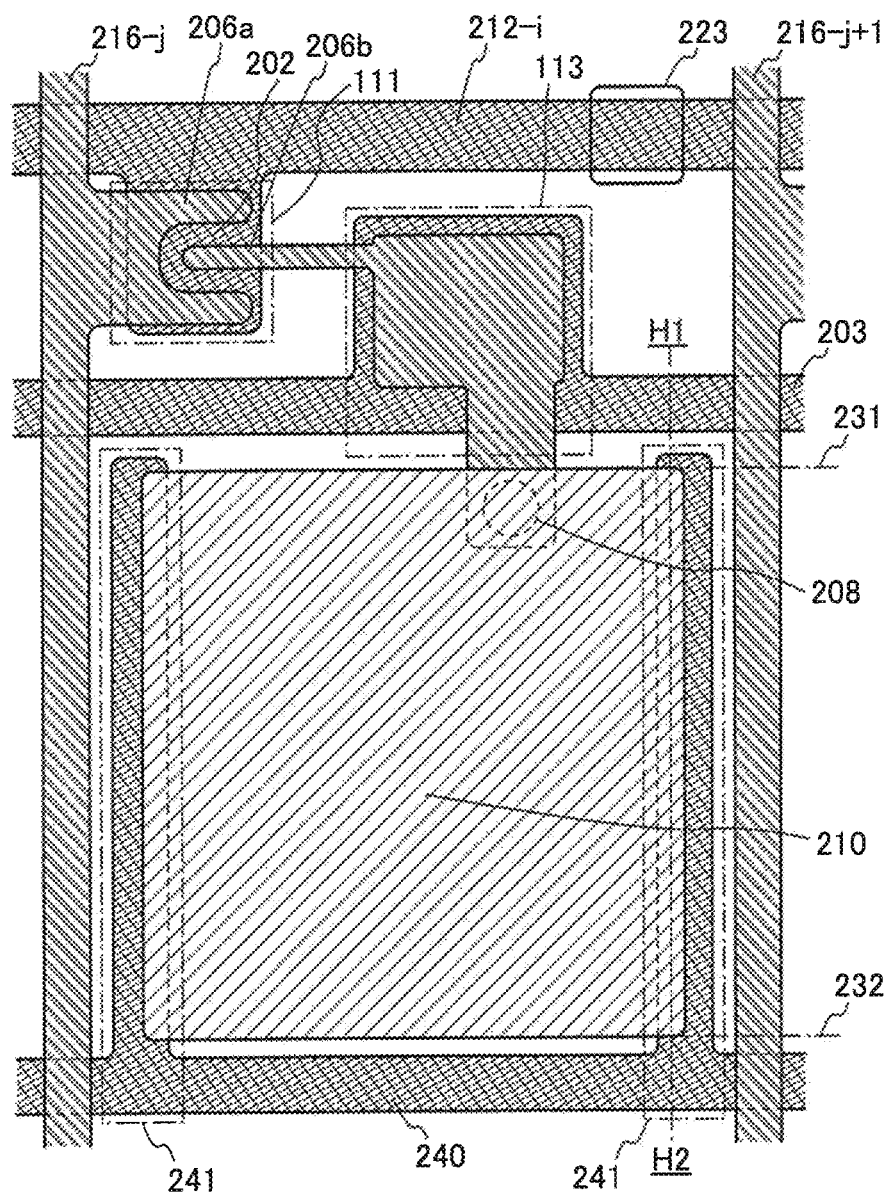
FIG. 6A is a top view and FIG. 6B is a cross-sectional view, illustrating an embodiment of the present invention.

Then, an example of a pixel structure which is different from those in FIG. 1 and FIGS. 4A and 4B will be described with reference to FIGS. 6A and 6B. FIG. 6A is a top view illustrating the planar structure of a pixel 140. A cross section H1-H2 in FIG. 6B corresponds to a cross section along chain line H1-H2 in FIG. 6A.

Figure 6B:
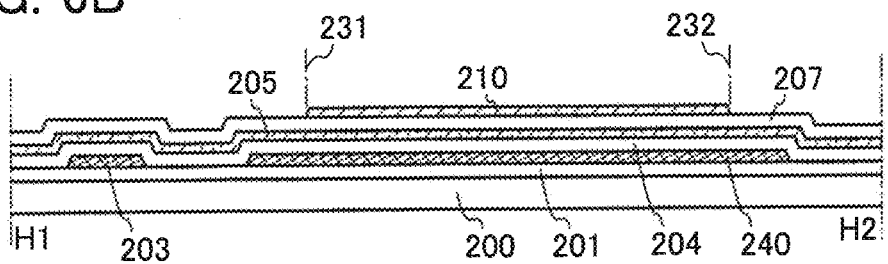

In the pixel 140 illustrated in FIGS. 6A and 6B, in addition to the wiring 203 serving as a capacitor electrode or a capacitor wiring, a wiring 240 for preventing formation of the parasitic transistor 115 is formed. The wiring 240 is formed using the same layer as the wiring 212 and the wiring 203. The wiring 240 includes an extending portion 241 along the wiring 216-$j$ or the wiring 216-$j$+1, and the extending portion 241 overlaps with part of the pixel electrode 210. The extending portion 241 is provided to extend beyond the end portion 231 and the end portion 232 of the pixel electrode 210.

When the potential of the wiring 240 is constantly lower than that of the image signal supplied to the liquid crystal element 112, electrical connection between the wiring 216-$j$ and the wiring 216-$j$+1 through the parasitic transistor 115 can be prevented. In the pixel 140 illustrated in FIGS. 6A and 6B, two extending portions 241 are provided, but it is sufficient as long as at least one extending portion 241 is provided between the wiring 216-$j$ and the wiring 216-$j$+1. In addition, the pixel electrode 210 and the wiring 240 including the extending portion 241 are not always needed to overlap with each other; however, when the wiring 240 and the pixel electrode 210 overlap with each other, the overlapping portion can serve as a Cs capacitor.

In order to prevent formation of the parasitic transistor, the potential of the wiring 203 needs to be constantly lower than that of the image signal supplied to the liquid crystal element 112. Note that by forming the region 223 over the wiring 203 and removing the semiconductor layer 205 over the wiring 203 in a manner similar to that of the wiring 212-$i$, formation of the parasitic transistor can be prevented and the potential of the wiring 203 can be set freely. That is, by forming the region 223 over the wiring 203, the potential of the wiring 203 can also be higher than that of the image signal.

Figure 7:
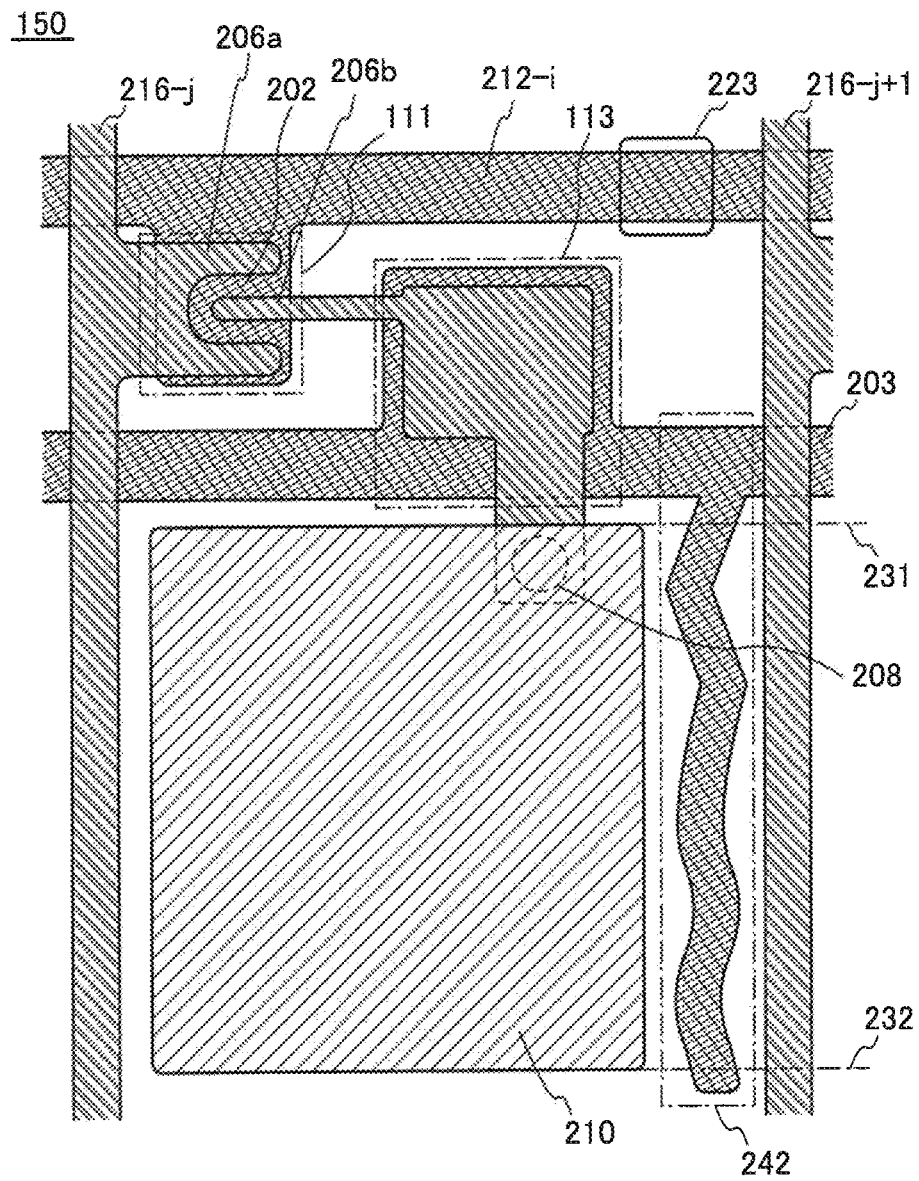
FIG. 7 is a top view illustrating an embodiment of the present invention.

A pixel 150 illustrated in FIG. 7 is an example of a structure in which one extending portion 242 including a bend portion or a curved portion is provided in one pixel. By providing the extending portion 242 so as to extend beyond the end portion 231 and the end portion 232 of the pixel electrode 210, the influence of the parasitic transistor 105 can be suppressed. That is, the parasitic transistor 116 including the extending portion 242 of the wiring 203, which serves as a gate electrode, between the wiring 216-$j$ and the wiring 216-$j$+1 can be formed. By constantly keeping the parasitic transistor 116 in an off state, electrical connection between the wiring 216-$j$ and the wiring 216-$j$+1 can be prevented. Although the pixel 150 has a structure in which the pixel electrode 210 does not overlap with the extending portion 242, when the pixel electrode 210 overlaps with the extending portion 242, the overlapping portion can serve as a Cs capacitor.

Next, examples of the structures of the terminal 105 and the terminal 106 will be described with reference to FIGS. 8A1 to 8B2. FIGS. 8A1 and 8A2 are a plan view and a cross-sectional view, respectively, of the terminal 105. A chain line J1-J2 in FIG. 8A1 corresponds to a cross section J1-J2 in FIG. 8A2. FIGS. 8B1 and 8B2 are a plan view and a cross-sectional view, respectively, of the terminal 106. A chain line K1-K2 in FIG. 8B1 corresponds to a cross section K1-K2 in FIG. 8B2. In the cross sections J1-J2 and K1-K2, J2 and K2 correspond to end portions of the substrate.

In the cross section J1-J2, the base layer 201 is formed over the substrate 200, and the wiring 212 is formed over the baser layer 201. The gate insulating layer 204, the semiconductor layer 205, and the insulating layer 207 are formed over the wiring 212. An electrode 221 is formed over the insulating layer 207, and the electrode 221 is electrically connected to the wiring 212 through the contact hole 219 formed in the gate insulating layer 204, the semiconductor layer 205, and the insulating layer 207.

In the cross section K1-K2, the base layer 201, the gate insulating layer 204, and the semiconductor layer 205 are formed over the substrate 200. The wiring 216 is formed over the semiconductor layer 205, and the insulating layer 207 is formed over the wiring 216. An electrode 222 is formed over the insulating layer 207, and the electrode 222 is electrically connected to the wiring 216 through a contact hole 220 formed in the insulating layer 207.

The terminal 107 can have a structure similar to that of the terminal 105 or the terminal 106.

The pixel region 102 and the terminal portion 104 are connected to each other through n wirings 216. When the distance between the adjacent wirings 216 is short in the wirings 216 from the pixel region 102 to the terminals 106 included in the terminal portion 104, carriers might be induced in the semiconductor layer 205 existing between the adjacent wirings 216 owing to the potential difference between the adjacent wirings 216, and unintended electrical connection between the adjacent wirings 216 might be caused.

Such a phenomenon can be prevented by providing the entire region from the pixel region 102 to the terminal portion 104 or a region between the adjacent wirings 216 with a conductive layer with an insulating layer interposed therebetween and setting a potential of the conductive layer to a potential at which carriers are not induced in the semiconductor layer 205.

For example, in the case of using an oxide semiconductor for the semiconductor layer 205, since many oxide semiconductors tend to be n-type, the potential of the conductive layer may be set to a potential lower than the potential supplied to the wiring 216.

In addition, by removing the semiconductor layer 205 existing between the adjacent wirings 216 in a step of forming a contact hole described later, unintended electrical connection between the adjacent wirings 216 can be prevented.

Figure 9A:
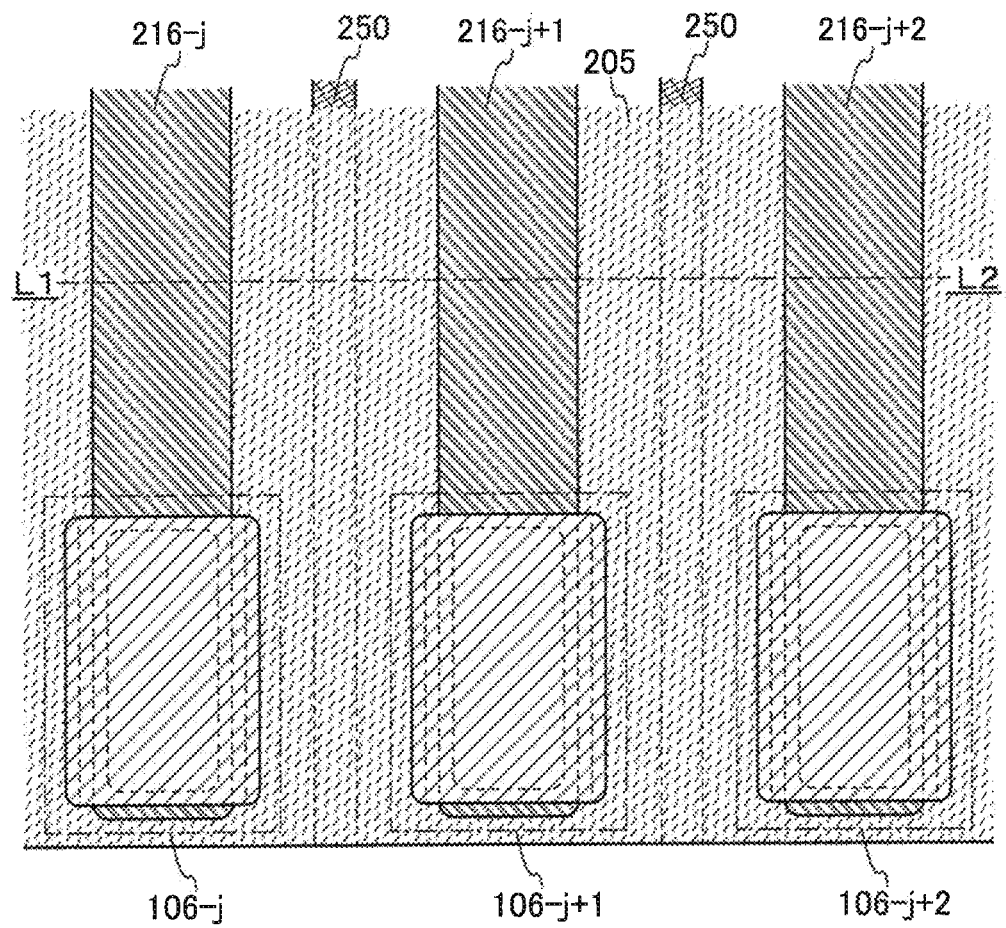
FIG. 9A is a top view and FIG. 9B is a cross-sectional view, illustrating an embodiment of the present invention.
Figure 9B:
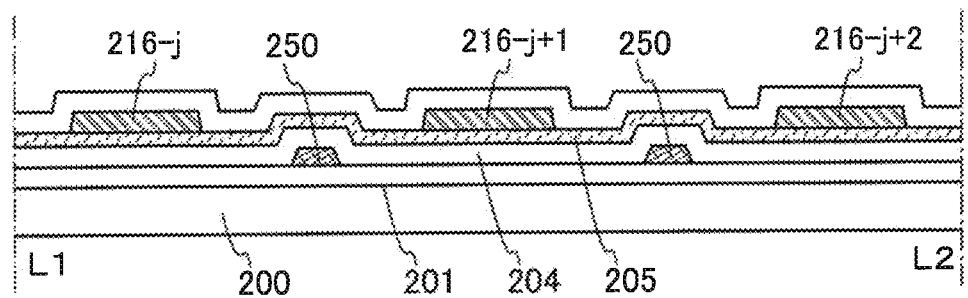

FIGS. 9A and 9B illustrate a structure in which a wiring 250 is provided as a conductive layer below a region between the adjacent wirings 216 with an insulating layer interposed therebetween. FIG. 9A is a top view of the planar structure in a portion where the wiring 216 is connected to the terminal 106. A cross section L1-L2 in FIG. 9B is taken along chain line L1-L2 in FIG. 9A. In FIG. 9A, the wiring 216-$j$ is connected to the terminal 106-$j$, the wiring 216-$j$+1 is connected to the terminal 106-$j$+1, and the wiring 216-$j$+2 is connected to the terminal 106-$j$+2. Note that the wiring 250 can be formed using the same layer as the wiring 212.

The wiring 250 is formed between the wiring 216-$j$ and the wiring 216-$j$+1 which are adjacent to each other with the gate insulating layer 204 interposed therebetween. In addition, the wiring 250 is formed between the wiring 216-$j$+1 and the wiring 216-$j$+2 which are adjacent to each other with the gate insulating layer 204 interposed therebetween. By providing the wiring 250 between the adjacent wirings 216 with the gate insulating layer 204 interposed therebetween and setting a potential of the wiring 250 to a potential at which carriers are not induced in the semiconductor layer 205, unintended electrical connection between the adjacent wirings 216 can be prevented.

Then, a manufacturing method of the pixel portion of the liquid crystal display device described with reference to FIG. 1 will be described with reference to FIGS. 10A to 10C and FIGS. 11A to 11C. Note that cross sections A1-A2, J1-J2, and K1-K2 in FIGS. 10A to 10C and FIGS. 11A to 11C are cross-sectional views of the portions taken along the chain lines A1-A2, J1-J2, and K1-K2 in FIG. 1 and FIGS. 8A1 to 8B2, respectively.

First, an insulating layer to be the base layer 201 is formed with a thickness of greater than or equal to 50 nm and less than or equal to 300 nm, preferably greater than or equal to 100 nm and less than or equal to 200 nm over the substrate 200. As the substrate 200, in addition to a glass substrate and a ceramic substrate, a plastic substrate or the like with heat resistance to withstand a process temperature in this manufacturing process can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm). In this embodiment, a substrate of aluminoborosilicate glass is used as the substrate 200.

The base layer 201 can be formed with a single-layer structure or a layered structure using one or more of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of impurity elements from the substrate

200. Note that in this specification, silicon nitride oxide contains more nitrogen than oxygen and, in the case where measurements are performed using RBS and HFS, contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The base layer 201 can be formed by a sputtering method, a CVD method, a coating method, a printing method, or the like as appropriate.

In this embodiment, a stack of layers of silicon nitride and silicon oxide is used as the base layer 201. Specifically, a layer of silicon nitride is formed with a thickness of 50 nm over the substrate 200, and a layer of silicon oxide is formed with a thickness of 150 nm over the layer of silicon nitride. Note that the base layer 201 may be doped with phosphorus (P) or boron (B).

When a halogen element such as chlorine or fluorine is contained in the base layer 201, a function of preventing diffusion of impurity elements from the substrate 200 can be further improved. The peak of the concentration of a halogen element contained in the base layer 201 may be higher than or equal to $1 \times 10^{15}/cm^3$ and lower than or equal to $1 \times 10^{20}/cm^3$ when measured by secondary ion mass spectrometry (SIMS).

Alternatively, gallium oxide may be used for the base layer 201. Further alternatively, a layered structure including a layer of gallium oxide and the above insulating layer may be used for the base layer 201. Gallium oxide is a material which is hardly charged; therefore, variation in threshold voltage due to charge buildup of the insulating layer can be suppressed.

Next, over the base layer 201, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 202, the wiring 203, and the wiring 212 are formed.

The conductive layer for forming the gate electrode 202, the wiring 203, and the wiring 212 can be formed to have a single-layer structure or a layered structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

Since the conductive layer is formed into a wiring, it is preferable to use Al or Cu which is a low-resistance material. When Al or Cu is used, signal delay is reduced, so that higher image quality can be expected. Al has low heat resistance; therefore, defects due to a hillock, a whisker, or migration tend to be caused. In order to prevent migration of Al, a layered structure including Al and a metal material having a higher melting point than Al such as Mo, Ti, or W is preferably used. In the case where a material containing Al is used for the conductive layer, the highest temperature in later steps is preferably lower than or equal to 380° C., more preferably lower than or equal to 350° C.

Also when Cu is used for the conductive layer, in order to prevent a defect due to migration and diffusion of Cu elements, a layered structure including Cu and a metal material having a higher melting point than Cu, such as Mo, Ti, or W, is preferably used. Further, in the case where a material containing Cu is used for the conductive layer, the highest temperature in later steps is preferably lower than or equal to 450° C.

In this embodiment, as the conductive layer, a Ti layer with a thickness of 5 nm is formed over the base layer 201 and a Cu layer with a thickness of 250 nm is formed over the Ti layer. After that, the conductive layer is selectively removed by etching through the first photolithography step, whereby the gate electrode 202, the wiring 203, and the wiring 212 are formed (see FIG. 10A).

Note that the resist mask used in the photolithography step may be formed by an inkjet method. An inkjet method needs no photomask; thus, manufacturing cost can be further reduced. The resist mask is to be removed after the etching step, and the description about the removal of the resist mask in each photolithography step is omitted in this embodiment. In addition, unless otherwise specified, a photolithography step in this specification includes a step of forming a resist mask, a step of etching a conductive layer or an insulating layer, and a step of removing the resist mask.

Then, the gate insulating layer 204 is formed with a thickness of greater than or equal to 50 nm and less than or equal to 800 nm, preferably greater than or equal to 100 nm and less than or equal to 600 nm over the gate electrode 202, the wiring 203, and the wiring 212. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate ($HfSi_xO_y$, (x>0, y>0)), hafnium silicate to which nitrogen is added, hafnium aluminate to which nitrogen is added, or the like by a plasma CVD method, a sputtering method, or the like. The gate insulating layer 204 is not limited to a single layer, and a stack of different layers may be used. For example, the gate insulating layer 204 may be formed in the following manner: a silicon nitride ($SiN_y$, (y>0)) layer is formed by a plasma CVD method as a gate insulating layer A and a silicon oxide ($SiO_x$, (x>0)) layer is stacked over the gate insulating layer A as a gate insulating layer B.

Other than a sputtering method and a plasma CVD method, the gate insulating layer 204 can be formed by a film formation method such as a high-density plasma CVD method using microwaves (e.g., a frequency of 2.45 GHz).

In this embodiment, a stack of layers of silicon nitride and silicon oxide is used as the gate insulating layer 204. Specifically, a layer of silicon nitride is formed with a thickness of 50 nm over the gate electrode 202, and a layer of silicon oxide is formed with a thickness of 100 nm over the layer of silicon nitride.

In addition, the gate insulating layer 204 also serves as a protective layer. With a structure in which the gate electrode 202 containing Cu is covered with the insulating layer containing silicon nitride, diffusion of Cu from the gate electrode 202 can be prevented.

In the case where the semiconductor layer formed later is formed using an oxide semiconductor, the gate insulating layer 204 may be formed using an insulating material containing the same kind of component as the oxide semiconductor. In the case of stacking layers of different materials to form the gate insulating layer 204, a layer in contact with the oxide semiconductor may be formed using an insulating material containing the same kind of component as the oxide semiconductor. This is because such a material is compatible with the oxide semiconductor, and therefore, the use of such a material for the gate insulating layer 204 enables a state of the interface between the gate insulating layer 204 and the oxide semiconductor to be kept well. Here, "the same kind of component as the oxide semiconductor" means one or more elements selected from constituent elements of the oxide semiconductor. For example, in the case where the oxide semiconductor is formed using an In—Ga—Zn-based oxide semiconductor material, gallium oxide is given as an insulating material containing the same kind of component as the oxide semiconductor.

In the case of employing a layered structure for the gate insulating layer 204, the gate insulating layer 204 may have a layered structure of a film formed using an insulating material containing the same kind of component as the oxide semiconductor and a film formed using a material different from that of the film.

In order that the oxide semiconductor layer does not contain hydrogen, a hydroxyl group, and moisture as little as possible, it is preferable to preheat the substrate 200 in a preheating chamber of a sputtering apparatus as pretreatment before the formation of the oxide semiconductor layer so that impurities such as hydrogen or moisture adsorbed on the substrate 200 or the gate insulating layer 204 are eliminated and removed. As an evacuation unit provided in the preheating chamber, a cryopump is preferable. Note that this preheating treatment can be omitted. Further, this preheating may be similarly performed on the substrate 200 over which the gate electrode 202, the wiring 203, and the wiring 212 are formed before the formation of the gate insulating layer 204.

An oxide semiconductor to be used for the semiconductor layer 205 preferably contains at least indium (In) or zinc (Zn). In particular, both In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For example, as the oxide semiconductor, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor layer is preferably formed using an oxide semiconductor which contains In, more preferably an oxide semiconductor which contains In and Ga. It is effective to perform dehydration or dehydrogenation in a later step in order to increase the purity of the oxide semiconductor layer.

Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than In, Ga, and Zn.

For the oxide semiconductor layer, a thin film expressed by a chemical formula $InMO_3(ZnO)_m$ (m>0) can be used. Here, M represents one or more metal elements selected from Sn, Zn, Ga, Al, Mn, and Co. As the oxide semiconductor, a material expressed by $In_3SnO_5(ZnO)_n$ (n>0) may also be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate values.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be single crystal or non-single-crystal. In the latter case, the oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm. Note that $R_a$ can be measured using an atomic force microscope (AFM).

As the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 16A to 16E, O surrounded by a circle represents tetracoodianate O and O surrounded by a double circle represents tricoodenate O.

Figure 16A:
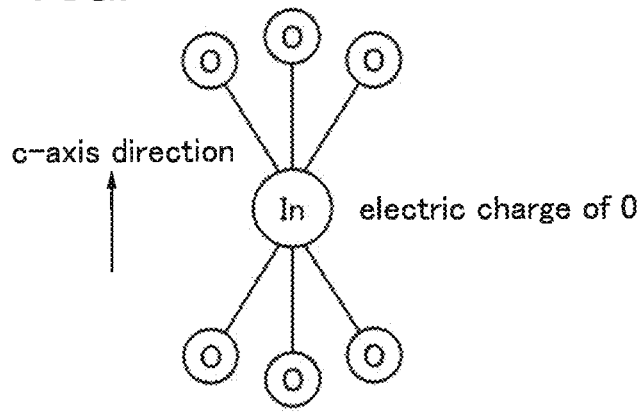
FIGS. 16A to 16E are views each illustrating a crystal structure of an oxide material.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0.

Figure 16D:
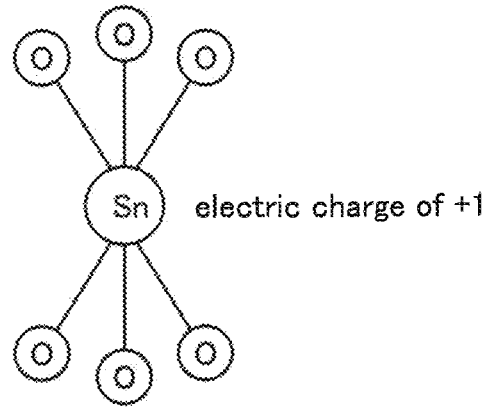
Figure 16B:
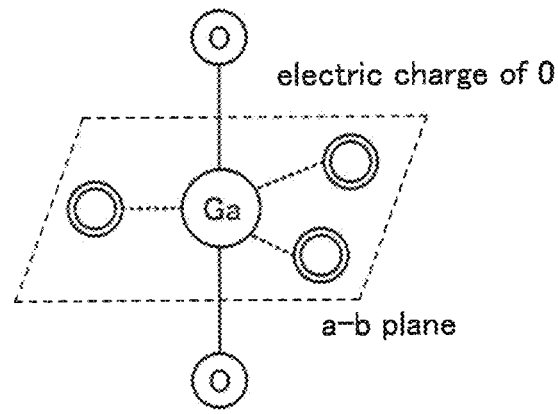

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
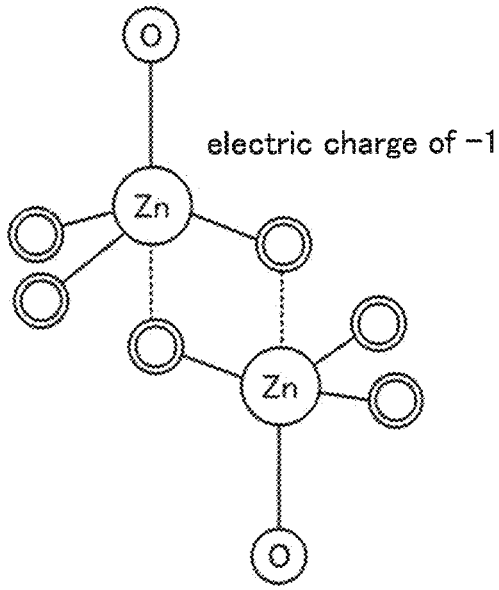
Figure 16C:
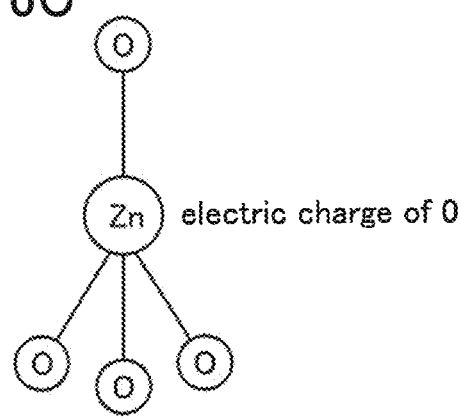

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, electric charge is +1.

FIG. 16E illustrates a small group including two Zn atoms. In FIG. 16E, one tetracoordinate O atom exists in each of an upper half and a lower half. In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the tetracoordinate Zn atom in FIG. 16C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. When the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

Metal atoms having the above coordination numbers are bonded to each other through a tetracoordinate O atom in the c-axis direction. In addition to the above, a medium group can be formed in a different manner by combining a plurality of small groups so that the total electric charge of the layered structure is 0.

FIG. 17A illustrates a model of a medium group included in a layered structure of an In—Sn—Zn-based oxide. FIG. 17B illustrates a large group including three medium groups. Note that FIG. 17C illustrates an atomic arrangement in the case where the layered structure in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 18A:
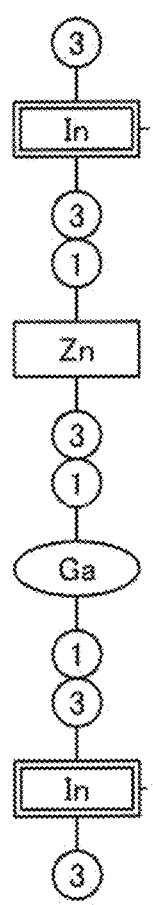
FIGS. 18A to 18C are views illustrating a crystal structure of an oxide material.

As an example, FIG. 18A illustrates a model of a medium group included in a layered structure of an In—Ga—Zn-based oxide.

In the medium group included in the layered structure of the In—Ga—Zn-based oxide in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 18B:
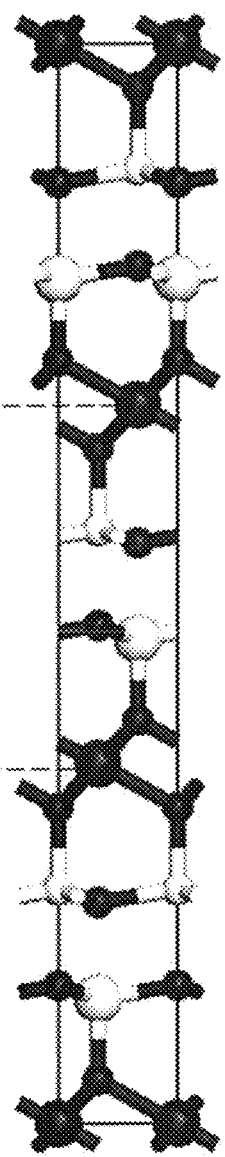
Figure 18C:
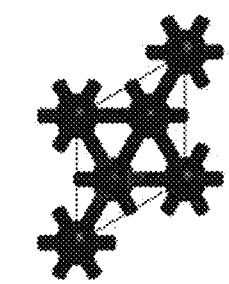

FIG. 18B illustrates a large group including three medium groups. Note that FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 18A but also a medium group in which the arrangement of the In atom, the Ga atom, and the Zn atom is different from that in FIG. 18A.

When the large group illustrated in FIG. 18B is repeated, crystal of an In—Ga—Zn-based oxide can be obtained. Note that a layered structure of the obtained crystal of an In—Ga—Zn-based oxide can be expressed as a composition formula, $InGaO_3(ZnO)_n$ (n is a natural number).

Figure 19A:
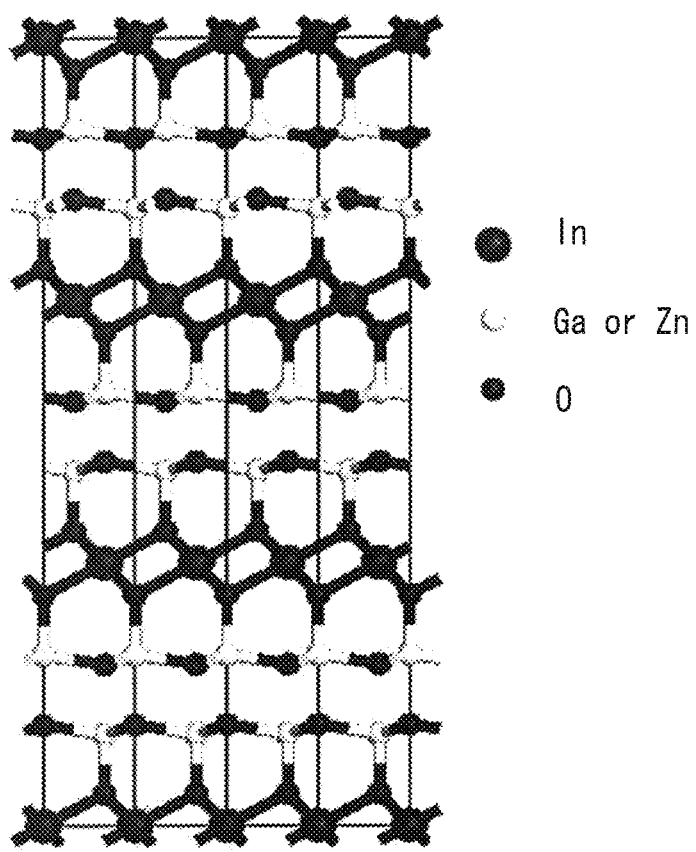
FIGS. 19A and 19B are views each illustrating a crystal structure of an oxide material.

In the case where n=1 ($InGaZnO_4$), a crystal structure illustrated in FIG. 19A can be obtained, for example Note that in the crystal structure in FIG. 19A, since a Ga atom and an In atom each have five ligands as illustrated in FIG. 16B, Ga can be replaced with In.

Figure 19B:
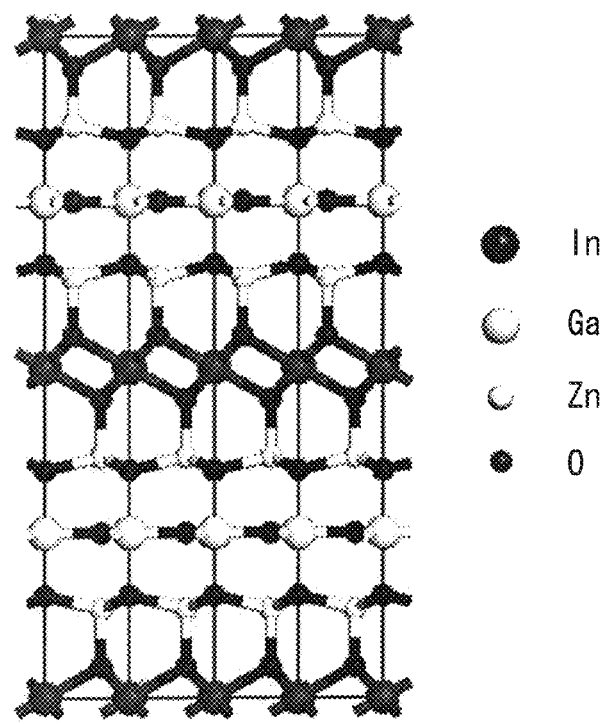

In the case where n=2 ($InGaZn_2O_5$), a crystal structure illustrated in FIG. 19B can be obtained, for example Note that in the crystal structure in FIG. 19B, since a Ga atom and an In atom each have five ligands as illustrated in FIG. 16B, Ga can be replaced with In.

Then, the semiconductor layer 205 is formed by a sputtering method, an evaporation method, a PCVD method, a PLD method, an ALD method, an MBE method, or the like.

The semiconductor layer 205 is formed in an oxygen gas atmosphere preferably by a sputtering method. At this time, the substrate temperature is set to higher than or equal to 100° C. and lower than or equal to 600° C., preferably higher than or equal to 150° C. and lower than or equal to 550° C., more preferably higher than or equal to 200° C. and lower than or equal to 500° C. The thickness of the semiconductor layer 205 is greater than or equal to 1 nm and less than or equal to 40 nm, preferably greater than or equal to 3 nm and less than or equal to 20 nm. As the substrate temperature in film formation is higher, the impurity concentration in the obtained semiconductor layer 205 is lower. Further, the atomic arrangement in the semiconductor layer 205 is ordered, the density thereof is increased, so that a polycrystal or a CAAC is likely to be formed. Furthermore, since an oxygen gas atmosphere is employed for the film formation, an unnecessary atom such as a rare gas atom is not contained in the semiconductor layer 205, so that a polycrystal or a CAAC is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. Note that as the semiconductor layer 205 is thinner, a short-channel effect of a transistor is reduced. However, when the semiconductor layer 205 is too thin, influence of interface scattering is enhanced; thus, the field effect mobility might be decreased (see FIG. 10B).

In the case of forming the semiconductor layer 205 using an In—Ga—Zn-based oxide material by a sputtering method, it is preferable to use an In—Ga—Zn-based oxide target having an atomic ratio of In:Ga:Zn=1:1:1, 4:2:3, 3:1:2, 1:1:2, 2:1:3, or 3:1:4. When the semiconductor layer 205 is formed using an In—Ga—Zn-based oxide target having the aforementioned atomic ratio, a polycrystal or a CAAC is likely to be formed. Note that an In—Ga—Zn-based oxide semiconductor can be referred to as IGZO. An In—Sn—Zn-based oxide semiconductor can be referred to as ITZO. In the case of forming the semiconductor layer 205 using an In—Sn—Zn-based oxide material by a sputtering method, it is preferable to use an In—Sn—Zn-based oxide target having an atomic ratio of In:Sn:Zn=1:1:1, 2:1:3, 1:2:2, or 20:45:35. When the semiconductor layer 205 is formed using an In—Sn—Zn-based oxide target having the aforementioned atomic ratio, a polycrystal or a CAAC is likely to be formed.

In this embodiment, the oxide semiconductor layer is formed to a thickness of 30 nm by a sputtering method with the use of an In—Ga—Zn-based oxide target. In addition, the oxide semiconductor layer can be formed by a sputtering method in a rare gas (typically, argon) atmosphere, an oxygen atmosphere, or a mixed atmosphere of a rare gas and oxygen (see FIG. 10B).

The relative density of the metal oxide target is higher than or equal to 90% and lower than or equal to 100%, preferably higher than or equal to 95% and lower than or equal to 99.9%. With the use of a metal oxide target with a high relative density, the formed oxide semiconductor layer can be dense.

It is preferable that a high-purity gas from which impurities such as hydrogen, water, a hydroxyl group, or hydride are removed be used as a sputtering gas for the formation of the oxide semiconductor layer. For example, in the case where argon is used for the sputtering gas, it is preferable that the purity be 9N, the dew point be −121° C., the content of $H_2O$ be lower than or equal to 0.1 ppb, and the content of $H_2$ be lower than or equal to 0.5 ppb. In the case where oxygen is used for the sputtering gas, it is preferable that the purity be 8N, the dew point be −112° C., the content of $H_2O$ be lower than or equal to 1 ppb, and the content of $H_2$ be lower than or equal to 1 ppb.

When the oxide semiconductor layer is formed, the substrate is held in a film formation chamber kept under a reduced pressure, and the substrate temperature is set to a temperature of higher than or equal to 100° C. and lower than or equal to 600° C., preferably higher than or equal to 300° C. and lower than or equal to 500° C. Note that in the case where Al is used for the wiring layer formed through the first photolithography step, the substrate temperature is set to lower than or equal to 380° C., preferably lower than or equal to 350° C. Alternatively, in the case where Cu is used for the wiring layer formed through the first photolithography step, the substrate temperature is set to lower than or equal to 450° C.

By heating the substrate during the film formation, the concentration of impurities such as hydrogen, moisture, hydride, or hydroxide in the oxide semiconductor layer can be reduced. In addition, damage by sputtering can be reduced. Then, a sputtering gas from which hydrogen and moisture are removed is introduced into the film formation chamber and moisture remaining therein is removed, and the oxide semiconductor layer is formed with the use of the above target.

In order to remove moisture remaining in the film formation chamber, an entrapment vacuum pump such as a cryopump, an ion pump, or a titanium sublimation pump is preferably used. As an evacuation unit, a turbo molecular pump provided with a cold trap may be used. In the film formation chamber which is evacuated with the cryopump, a hydrogen atom, a compound containing a hydrogen atom such as water ($H_2O$) (more preferably, also a compound containing a carbon atom), and the like are removed, whereby the impurity concentration in the oxide semiconductor layer formed in the film formation chamber can be reduced.

An example of the film formation conditions is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current power source is preferably used, in which case powder substances (also referred to as particles or dust) that are generated in film formation can be reduced and the film thickness can be uniform.

The concentrations of alkali metals such as sodium (Na), lithium (Li), and potassium (K) in the oxide semiconductor layer are as follows. The concentration of Na is lower than or equal to $5\times10^{16}$ $cm^{-3}$, preferably lower than or equal to $1\times10^{16}$ $cm^{-3}$, more preferably lower than or equal to $1\times10^{15}$ $cm^{-3}$. The concentration of Li is lower than or equal to $5\times10^{15}$ $cm^{-3}$, preferably lower than or equal to $1\times10^{15}$ $cm^{-3}$. The concentration of K is lower than or equal to $5\times10^{15}$ $cm^{-3}$, preferably lower than or equal to $1\times10^{15}$ $cm^{-3}$.

Note that it has been pointed out that an oxide semiconductor is insensitive to impurities, there is no problem when a considerable amount of metal impurities is contained in the oxide semiconductor, and therefore, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). However, such consideration is not appropriate. An alkali metal is not an element included in an oxide semiconductor, and therefore, is an impurity. Also, an alkaline earth metal is an impurity in the case where an alkaline earth metal is not an element included in an oxide semiconductor. When an insulating layer in contact with the oxide semiconductor layer is an oxide, an alkali metal, in particular, Na diffuses into the insulating layer and Na becomes Na$^+$. Further, in the oxide semiconductor layer, Na cuts or enters a bond between metal and oxygen which are included in an oxide semiconductor. As a result, for example, deterioration of transistor characteristics, such as a normally-on state of the transistor due to shift of a threshold voltage in the negative direction, or reduction in mobility, occurs. In addition, variation in characteristics also occurs. Such deterioration of transistor characteristics and variation in characteristics due to an impurity remarkably appear when the hydrogen concentration in the oxide semiconductor layer is very low. Therefore, the concentration of an alkali metal in the oxide semiconductor is strongly required to set to the above value in the case where the hydrogen concentration in the oxide semiconductor is lower than or equal to $5\times10^{19}$ cm$^{-3}$, particularly lower than or equal to $5\times10^{18}$ cm$^{-3}$.

Next, first heat treatment is performed. By the first heat treatment, excessive hydrogen (including water and a hydroxyl group) in the oxide semiconductor layer is removed (dehydration or dehydrogenation), whereby the impurity concentration in the oxide semiconductor layer can be reduced.

The first heat treatment is preferably performed at a temperature of higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is lower than or equal to 20 ppm (the dew point: −55° C.), preferably lower than or equal to 1 ppm, more preferably lower than or equal to 10 ppb in the case where measurement is performed using a dew-point meter of a cavity ring-down laser spectroscopy (CRDS) system). Note that in the case where Al is used for the wiring layer formed through the first photolithography step, the heat treatment temperature is set to lower than or equal to 380° C., preferably lower than or equal to 350° C. Alternatively, in the case where Cu is used for the wiring layer formed through the first photolithography step, the heat treatment temperature is set to lower than or equal to 450° C. In this embodiment, the substrate is introduced into an electric furnace which is a kind of heat treatment apparatuses, and heat treatment is performed on the oxide semiconductor layer at 450° C. in a nitrogen atmosphere for one hour.

Note that a heat treatment apparatus is not limited to an electric furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the first heat treatment can employ GRTA, in which the substrate is moved into an inert gas heated at high temperature, and heated for several minutes there, and then the substrate is moved out of the inert gas.

When the heat treatment is performed in an inert gas atmosphere such as a nitrogen atmosphere or a rare gas atmosphere, an oxygen atmosphere, or an ultra-dry air atmosphere, it is preferable that the atmosphere do not contain water, hydrogen, and the like. The purity of nitrogen, oxygen, or a rare gas which is introduced into a heat treatment apparatus is set to higher than or equal to 6N (99.9999%), preferably higher than or equal to 7N (99.99999%) (that is, the impurity concentration is lower than or equal to 1 ppm, preferably lower than or equal to 0.1 ppm).

The first heat treatment is preferably performed in such a manner that heat treatment in a reduced pressure atmosphere or an inert gas atmosphere is completed and then, the atmosphere is changed to an oxidizing atmosphere while the temperature is kept, and heat treatment is further performed. By the heat treatment in a reduced pressure atmosphere or an inert gas atmosphere, the impurity concentration in the oxide semiconductor layer can be reduced; however, at the same time, oxygen deficiency occurs. The oxygen deficiency generated at this time can be reduced by heat treatment in an oxidizing atmosphere.

The oxide semiconductor purified by a sufficient reduction in hydrogen concentration, in which defect levels in the energy gap due to oxygen deficiency are reduced as a result of sufficient supply of oxygen, has a carrier concentration of lower than $1\times10^{12}$/cm$^3$, preferably lower than $1\times10^{11}$/cm$^3$, more preferably lower than $1.45\times10^{10}$/cm$^3$. For example, the off-state current (per unit channel width (1 μm) here) at room temperature (25° C.) is less than or equal to 100 zA/μm (1 zA (zeptoampere) is $1\times10^{-21}$ A), preferably less than or equal to 10 zA/μm. The off-state current at 85° C. is less than or equal to 100 zA/μm ($1\times10^{-19}$ A/μm), preferably less than or equal to 10 zA/μm ($1\times10^{-20}$ A/μm). The transistor 111 with very excellent off-state current characteristics can be obtained with the use of such an i-type (intrinsic) or substantially i-type oxide semiconductor.

The electric characteristics of a transistor including a highly purified oxide semiconductor, such as the threshold voltage and the on-state current, have almost no temperature dependence. Further, the transistor characteristics hardly change due to light deterioration.

As described above, variation in electric characteristics of a transistor including a highly purified and electrically i-type (intrinsic) oxide semiconductor obtained by reducing the oxygen deficiency is suppressed and thus, the transistor is electrically stable. Accordingly, a liquid crystal display device including an oxide semiconductor, which has high reliability and stable electric characteristics, can be provided.

Then, a conductive layer for forming the source electrode 206a, the drain electrode 206b, and the wiring 216 is formed over the semiconductor layer 205. The conductive layer for forming the source electrode 206a, the drain electrode 206b, and the wiring 216 can be formed using a material and a method similar to those of the gate electrode 202. Further, the conductive layer for forming the source electrode 206a, the drain electrode 206b, and the wiring 216 may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$; abbreviated to ITO), an alloy of indium oxide and zinc oxide ($In_2O_3$—ZnO), or any of these metal oxide materials in which silicon oxide is contained can be used.

In this embodiment, as the conductive layer, a Ti layer with a thickness of 5 nm is formed over the semiconductor layer 205 and a Cu layer with a thickness of 250 nm is formed over the Ti layer. After that, the conductive layer is selectively removed by etching using a resist mask formed through a second photolithography step, whereby the source electrode 206a, the drain electrode 206b, and the wiring 216 are formed (see FIG. 10C).

Then, the insulating layer 207 is formed over the source electrode 206a, the drain electrode 206b, and the wiring 216 (see FIG. 11A). The insulating layer 207 can be formed using a material and a method similar to those of the gate insulating layer 204 or the base layer 201. A sputtering method is preferably employed in terms of low possibility of entry of hydrogen, water, and the like. If hydrogen is contained in the insulating layer 207, the hydrogen might enter the oxide semiconductor layer or extract oxygen from the oxide semiconductor layer, which might cause a reduction in resistance of the oxide semiconductor layer (which means that the oxide semiconductor layer becomes n-type). Therefore, it is important to form the insulating layer 207 by a method through which hydrogen and an impurity containing hydrogen are not contained in the insulating layer 207.

As the insulating layer 207, an inorganic insulating material such as silicon oxide, silicon oxynitride, hafnium oxide, aluminum oxide, or gallium oxide can be typically used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the insulating layer 207 or as a layer stacked over or below the insulating layer 207.

In this embodiment, a 200-nm-thick silicon oxide layer is formed as the insulating layer 207 by a sputtering method. The substrate temperature in film formation may be higher than or equal to room temperature and lower than or equal to 300° C. and is 100° C. in this embodiment. The silicon oxide layer can be formed by a sputtering method in a rare gas (typically, argon) atmosphere, an oxygen atmosphere, or a mixed atmosphere containing a rare gas and oxygen. As a target, silicon oxide or silicon can be used. For example, a silicon oxide layer can be formed with the use of silicon as a target by sputtering in an atmosphere containing oxygen.

In order to remove remaining moisture from the film formation chamber at the time of formation of the insulating layer 207, an entrapment vacuum pump (such as a cryopump) is preferably used. When the insulating layer 207 is formed in the film formation chamber evacuated using a cryopump, the impurity concentration in the insulating layer 207 can be reduced. In addition, as an evacuation unit for removing moisture remaining in the film formation chamber of the insulating layer 207, a turbo molecular pump provided with a cold trap may be used.

It is preferable that a high-purity gas from which impurities such as hydrogen, water, a hydroxyl group, or a hydride are removed be used as a sputtering gas used to form the insulating layer 207.

Then, second heat treatment may be performed in a reduced pressure atmosphere, an inert gas atmosphere, an oxygen gas atmosphere, or an ultra-dry air atmosphere (preferably at a temperature of higher than or equal to 200° C. and lower than or equal to 600° C., for example, a temperature of higher than or equal to 250° C. and lower than or equal to 550° C.). Note that in the case where Al is used for the wiring layer formed through the first photolithography step or the second photolithography step, the heat treatment temperature is set to lower than or equal to 380° C., preferably lower than or equal to 350° C. Alternatively, in the case where Cu is used for the wiring layer formed through the first photolithography step or the second photolithography step, the heat treatment temperature is set to lower than or equal to 450° C. For example, the second heat treatment may be performed at 450° C. for one hour in a nitrogen atmosphere. In the second heat treatment, the temperature is increased while part of the oxide semiconductor layer (a channel formation region) is in contact with the insulating layer 207, and oxygen can be supplied from the insulating layer 207 containing oxygen to the semiconductor layer 205. It is preferable that the above atmosphere do not contain water, hydrogen, or the like.

Next, by a third photolithography step, a resist mask is formed, and the insulating layer 207 over the drain electrode 206b is selectively removed, so that the contact hole 208 is formed. In the cross section K1-K2, the insulating layer 207 over the wiring 216 is selectively removed to form the contact hole 220. In the cross section J1-J2, the insulating layer 207, the semiconductor layer 205, and the gate insulating layer 204 over the wiring 212 are selectively removed to form the contact hole 219 (see FIG. 11B). Although not illustrated, in this photolithography step, the region 223 is formed in a manner similar to that of the contact hole 219.

The etching of the insulating layer 207, the semiconductor layer 205, and the gate insulating layer 204 may be performed using dry etching, wet etching, or a combination of dry etching and wet etching. A gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

As the dry etching, a parallel plate reactive ion etching (RIE) method, an inductively coupled plasma (ICP) etching method, or the like can be used. Since the base layer 201 has a function of preventing diffusion of impurity elements from the substrate 200, etching conditions are preferably adjusted such that the base layer 201 is not etched as much as possible in the etching.

In general, etching of the semiconductor layer and formation of the contact hole are separately performed through their respective photolithography steps and etching steps; according to the manufacturing process of this embodiment, etching of the semiconductor layer and formation of the contact hole can be performed by one photolithography step and one etching step. Therefore, not only the number of photomasks but the number of photolithography steps can be reduced, which can reduce the number of etching steps after the photolithography steps. That is, a liquid crystal display device can be manufactured with a small number of photolithography steps, at low cost with high productivity.

In addition, according to the manufacturing process of this embodiment, a photoresist is not directly formed on the oxide semiconductor layer. Further, since the channel formation region in the oxide semiconductor layer is protected by the insulating layer 207, moisture is not attached to the channel formation region in the oxide semiconductor layer in separation and cleaning steps of the photoresist; thus, variation in characteristics of the transistor 111 is reduced and the reliability is increased.

Then, over the insulating layer 207, a light-transmitting conductive layer to be the pixel electrode 210, the electrode 221, and the electrode 222 is formed with a thickness of greater than or equal to 30 nm and less than or equal to 200 nm, preferably greater than or equal to 50 nm and less than or equal to 100 nm by a sputtering method, a vacuum evaporation method, or the like (see FIG. 11C).

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Alternatively, a material formed of 1 to 10 graphene sheets (a graphene sheet corresponds to a single layer of graphite) may be used.

In this embodiment, an ITO layer with a thickness of 80 nm is formed as the light-transmitting conductive layer, and a resist mask is formed by a fourth photolithography step, and then the light-transmitting conductive layer is selectively etched, thereby forming the pixel electrode 210, the electrode 221, and the electrode 222.

The pixel electrode 210 is electrically connected to the drain electrode 206b through the contact hole 208. The electrode 221 is electrically connected to the wiring 212-i through the contact hole 219. The electrode 222 is electrically connected to the wiring 216-j through the contact hole 220. Note that a light-transmitting electrode is not necessarily formed in the region 223.

In addition, in the contact hole 219 and the contact hole 220 formed in the terminal portion 103 and the terminal portion 104, it is important that the wiring 212 and the wiring 216 be not kept in an exposed state and covered with an oxide conductive material such as ITO. When the wiring 212 and the wiring 216 which are metal layers are kept in an exposed state, exposed surfaces are oxidized and contact resistance with an FPC or the like is increased. The increase in contact resistance causes distortion in waveform or delay of a signal that is input from the outside, and a signal from the outside cannot be transmitted correctly, so that the reliability of the semiconductor device is lowered. By covering the exposed surfaces of the wiring 212 and the wiring 216 with an oxide conductive material such as ITO, the increase in contact resistance can be prevented, and the reliability of the semiconductor device can be improved.

In accordance with this embodiment, a liquid crystal display device can be manufactured with a smaller number of photolithography steps than in a conventional manufacturing method. Consequently, a liquid crystal display device can be manufactured at low cost with high productivity.

In this embodiment, an example of a bottom gate transistor is described, but this embodiment can also be applied to a top gate transistor.

This embodiment can be freely combined with any of other embodiments.

Embodiment 2

Figure 12A:
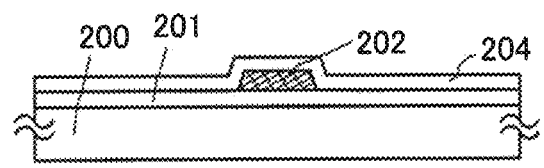
FIGS. 12A to 12C are cross-sectional views illustrating an embodiment of the present invention.
Figure 12B:
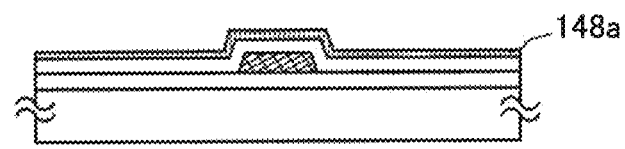
Figure 12C:
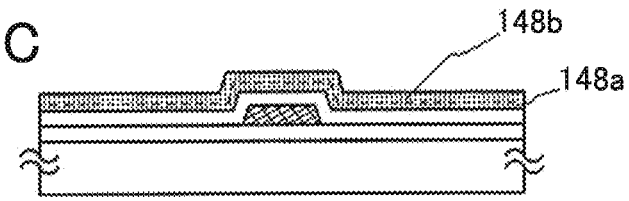

In this embodiment, an example of a process which is partially different from that described in Embodiment 1 will be described with reference to FIGS. 12A to 12C. Note that in FIGS. 12A to 12C, the same reference numerals are used for the same parts as those in Embodiment 1, and description of the parts with the same reference numerals will be omitted here.

First, in a manner similar to that of Embodiment 1, a conductive layer is formed over a substrate 200 having an insulating surface, and then, a gate electrode 202 is formed through a first photolithography step and an etching step.

An insulating layer serving as a base layer may be provided between the substrate 200 and the gate electrode 202. In this embodiment, a base layer 201 is provided. The base layer 201 has a function of preventing diffusion of impurity elements (such as Na) from the substrate 200, and can be formed using a film selected from a silicon oxide film, a silicon oxynitride film, a silicon nitride film, a hafnium oxide film, an aluminum oxide film, a gallium oxide film, and a gallium aluminum oxide film. The structure of the base layer is not limited to a single-layer structure, and may be a layered structure of a plurality of the above films.

In this embodiment, because the film formation temperature of a semiconductor layer to be formed later is higher than or equal to 200° C. and lower than or equal to 450° C. and the temperature of heat treatment after the formation of the semiconductor layer is higher than or equal to 200° C. and lower than or equal to 450° C., the gate electrode 202 is formed of stacked layers of copper for a lower layer and molybdenum for an upper layer or stacked layers of copper for a lower layer and tungsten for an upper layer.

Then, a gate insulating layer 204 is formed over the gate electrode 202 by a CVD method, a sputtering method, or the like in a manner similar to that of Embodiment 1. The structure obtained through the process up to here is illustrated in the cross-sectional view of FIG. 12A.

Next, a first oxide semiconductor layer is formed to a thickness of greater than or equal to 1 nm and less than or equal to 10 nm over the gate insulating layer 204. In this embodiment, the first oxide semiconductor layer is formed to a thickness of 5 nm in an oxygen atmosphere, an argon atmosphere, or a mixed atmosphere of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, a first crystalline oxide semiconductor layer 148a is formed (see FIG. 12B).

Next, a second oxide semiconductor layer with a thickness of more than 10 nm is formed over the first crystalline oxide semiconductor layer 148a. In this embodiment, the second oxide semiconductor layer is formed to a thickness of 25 nm by using a sputtering gas of oxygen, argon, or a mixture of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used; the distance between the substrate and the target is 170 mm; the substrate temperature is 400° C.; the pressure is 0.4 Pa; and the direct current (DC) power is 0.5 kW.

Then, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, a second crystalline oxide semiconductor layer 148b is formed (see FIG. 12C).

The following process is similar to that of Embodiment 1, that is, a source electrode 206a, a drain electrode 206b, an insulating layer 207, and the like are formed; and the insulating layer 207, the first crystalline oxide semiconductor layer 148a, and the second crystalline oxide semiconductor layer 148b are etched using the same resist mask, by which the number of photolithography steps is reduced.

Thus, in accordance with Embodiment 1, the transistor 111 can be obtained. Note that in the case of using this embodiment, the stacked layers of the first crystalline oxide semiconductor layer 148a and the second crystalline oxide semiconductor layer 148b form a semiconductor layer including a channel formation region of the transistor. The first crystalline oxide semiconductor layer 148a and the second crystalline oxide semiconductor layer 148b have c-axis alignment. Note that the first crystalline oxide semiconductor layer 148a and the second crystalline oxide semiconductor layer 148b comprise an oxide including a crystal with c-axis alignment (also referred to as C-Axis Aligned Crystal (also referred to as CAAC)), which has neither a single crystal structure nor an amorphous structure. The first crystalline oxide semiconductor layer 148a and the second crystalline oxide semiconductor layer 148b partly include a crystal grain boundary.

In order to obtain the CAAC, it is important to form hexagonal crystal in an initial stage of deposition of an oxide semiconductor film and cause crystal growth from the hexagonal crystal as a seed crystal. The substrate heating temperature is higher than or equal to 100° C. and lower than or equal to 500° C., preferably higher than or equal to 200° C. and lower than or equal to 400° C., more preferably higher than or equal to 250° C. and lower than or equal to 300° C. In addition to this, by performing heat treatment on the deposited oxide semiconductor film at a temperature higher than the substrate heating temperature at the deposition, microdefects in the film and defects at the interface of a stacked layer can be repaired.

In the case of the transistor including stacked layers of the first crystalline oxide semiconductor layer and the second crystalline oxide semiconductor layer, the amount of change in threshold voltage of the transistor between before and after being irradiated with light or being subjected to a bias-temperature (BT) stress test can be reduced; thus, such a transistor has stable electrical characteristics.

This embodiment can be freely combined with any of the other embodiments.

Embodiment 3

One mode of a display device in which any of the transistors described in Embodiment 1 and Embodiment 2 is used is illustrated in FIGS. 13A and 13B.

FIG. 13A is a plan view of a panel in which a transistor 4010 and a liquid crystal element 4013 are sealed between a first substrate 4001 and a second substrate 4006 with a sealant 4005. FIG. 13B is a cross-sectional view taken along line M-N in FIG. 13A.

The sealant 4005 is provided so as to surround a pixel portion 4002 provided over the first substrate 4001. The second substrate 4006 is provided over the pixel portion 4002. Accordingly, the pixel portion 4002 is sealed together with a liquid crystal layer 4008 by the first substrate 4001, the sealant 4005, and the second substrate 4006.

Further, an input terminal 4020 is provided in a region over the first substrate 4001 outside a region surrounded by the sealant 4005, and flexible printed circuits (FPCs) 4018a and 4018b are connected to the input terminal 4020. The FPC 4018a is electrically connected to a signal line driver circuit 4003 which is separately provided over another substrate, and the FPC 4018b is electrically connected to a scan line driver circuit 4004 which is separately provided over another substrate. Various signals and potentials supplied to the pixel portion 4002 are supplied from the signal line driver circuit 4003 and the scan line driver circuit 4004 via the FPC 4018a and the FPC 4018b.

Note that a connection method of separately formed driver circuits is not particularly limited, and a chip on glass (COG) method, a wire bonding method, a tape carrier package (TCP) method, a tape automated bonding (TAB) method, or the like can be used.

Although not shown, the signal line driver circuit 4003 or the scan line driver circuit 4004 may be provided over the substrate 4001 with the use of the transistor disclosed in this specification.

As a display element provided in the display device, a liquid crystal element (also referred to as a liquid crystal display element) can be used. Furthermore, a display medium whose contrast is changed by an electric effect, such as electronic ink, can be used.

The display device illustrated in FIGS. 13A and 13B includes an electrode 4015 and a wiring 4016. The electrode 4015 and the wiring 4016 are electrically connected to a terminal included in the FPC 4018a via an anisotropic conductive layer 4019.

The electrode 4015 is formed using the same conductive layer as a first electrode 4030, and the wiring 4016 is formed using the same conductive layer as a source and a drain electrode of the transistor 4010.

In this embodiment, any of the transistors described in Embodiment 1 and Embodiment 2 can be applied to the transistor 4010. The transistor 4010 provided in the pixel portion 4002 is electrically connected to a display element to form a display panel. A variety of display elements can be used for the display element as long as display can be performed.

FIGS. 13A and 13B illustrate an example of a display device in which a liquid crystal element is used as a display element. In FIGS. 13A and 13B, the liquid crystal element 4013 which is a display element includes the first electrode 4030, a second electrode 4031, and the liquid crystal layer 4008. Note that insulating layers 4032 and 4033 serving as alignment films are provided so that the liquid crystal layer 4008 is provided therebetween. The second electrode 4031 is formed on the second substrate 4006 side. The first electrode 4030 and the second electrode 4031 are stacked with the liquid crystal layer 4008 provided therebetween.

A reference numeral 4035 denotes a columnar spacer which is formed over the second substrate 4006 using an insulating layer to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is higher than or equal to $1\times10^9$ Ω·cm, preferably higher than or equal to $1\times10^{11}$ Ω·cm, more preferably higher than or equal to $1\times10^{12}$ Ω·cm. The value of the specific resistivity in this specification is measured at 20° C.

The size of storage capacitor formed in the liquid crystal display device is set considering the leakage current of the transistor provided in the pixel portion or the like so that electric charge can be held for a predetermined period. By using the transistor in which a highly purified oxide semiconductor is used for a semiconductor layer including a channel region, it is enough to provide a storage capacitor having capacitance that is less than or equal to 1/3, preferably less than or equal to 1/5 of liquid crystal capacitance of each pixel.

In the transistor used in this embodiment, including a highly purified oxide semiconductor layer, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption. In addition, in the transistor including a highly purified oxide semiconductor layer, a potential applied to the liquid crystal element can be held even when a storage capacitor is not provided.

The field-effect mobility of the transistor including a highly purified oxide semiconductor layer used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. However, one embodiment of the present invention is not limited to a liquid crystal display device for color display and can be applied to a liquid crystal display device for monochrome display.

In FIGS. 13A and 13B, a flexible substrate as well as a glass substrate can be used as any of the first substrate 4001 and the second substrate 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The liquid crystal display device displays an image by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode and the second electrode (each of which may be called a pixel electrode, a common electrode, an opposite electrode, or the like) for applying voltage to the display element may have light-transmitting properties or light-reflecting properties, which depends on the direction in which light is extracted, the position where the electrode is provided, and the pattern structure of the electrode.

Any of the first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. Alternatively, a material including 1 to 10 graphene sheets (a graphene sheet corresponds to a single layer of graphite) may be used.

One of the first electrode 4030 and the second electrode 4031 can be formed using one or plural kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition including a conductive high molecule (also referred to as a conductive polymer) can be used for the first electrode 4030 and the second electrode 4031. As the conductive high molecule a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, since a transistor is easily broken by static electricity or the like, a protection circuit is preferably provided. The protection circuit is preferably formed using a non-linear element.

As described above, by using any of the transistors described in Embodiment 1 and Embodiment 2, a liquid crystal display device with high reliability can be provided. Note that the transistors described in Embodiment 1 and Embodiment 2 can be applied to not only semiconductor devices having the display functions described above but also semiconductor devices having a variety of functions, such as a power device which is mounted on a power supply circuit, a semiconductor integrated circuit such as LSI, and a semiconductor device having an image sensor function of reading information of an object.

This embodiment can be freely combined with other embodiments

Embodiment 4

In this embodiment, with the use of a display device which switches between an image for a left eye and an image for a right eye at high speed, an example in which a 3D image which is a moving image or a still image is seen with dedicated glasses with which videos of the display device are synchronized is described with reference to FIGS. 14A and 14B.

Figure 14A:
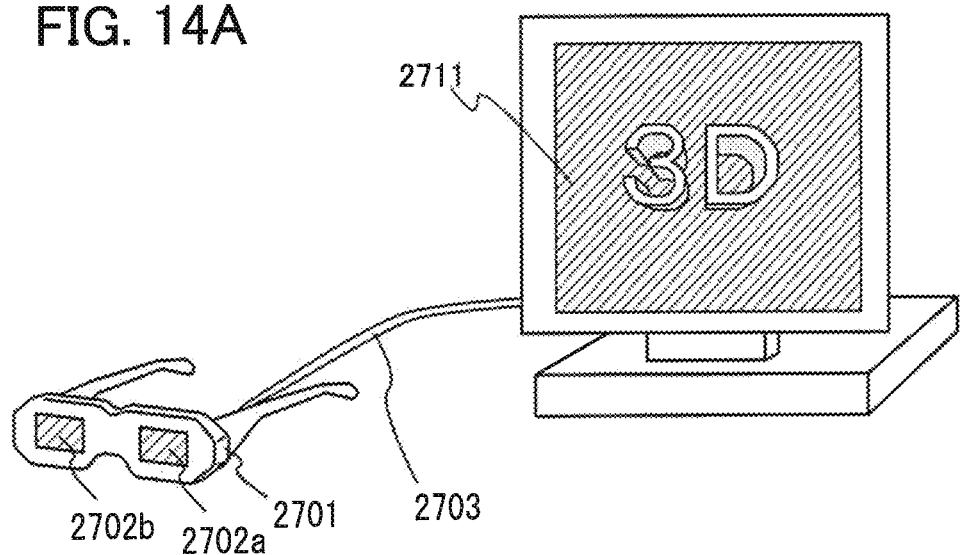
FIGS. 14A and 14B are views illustrating an embodiment of the present invention.

FIG. 14A illustrates an external view in which a display device 2711 and dedicated glasses 2701 are connected to each other with a cable 2703. The liquid crystal display device disclosed in this specification can be used as the display device 2711. In the dedicated glasses 2701, shutters provided in a panel 2702a for a left eye and a panel 2702b for a right eye are alternately opened and closed, whereby a user can see an image of the display device 2711 as a 3D image.

Figure 14B:
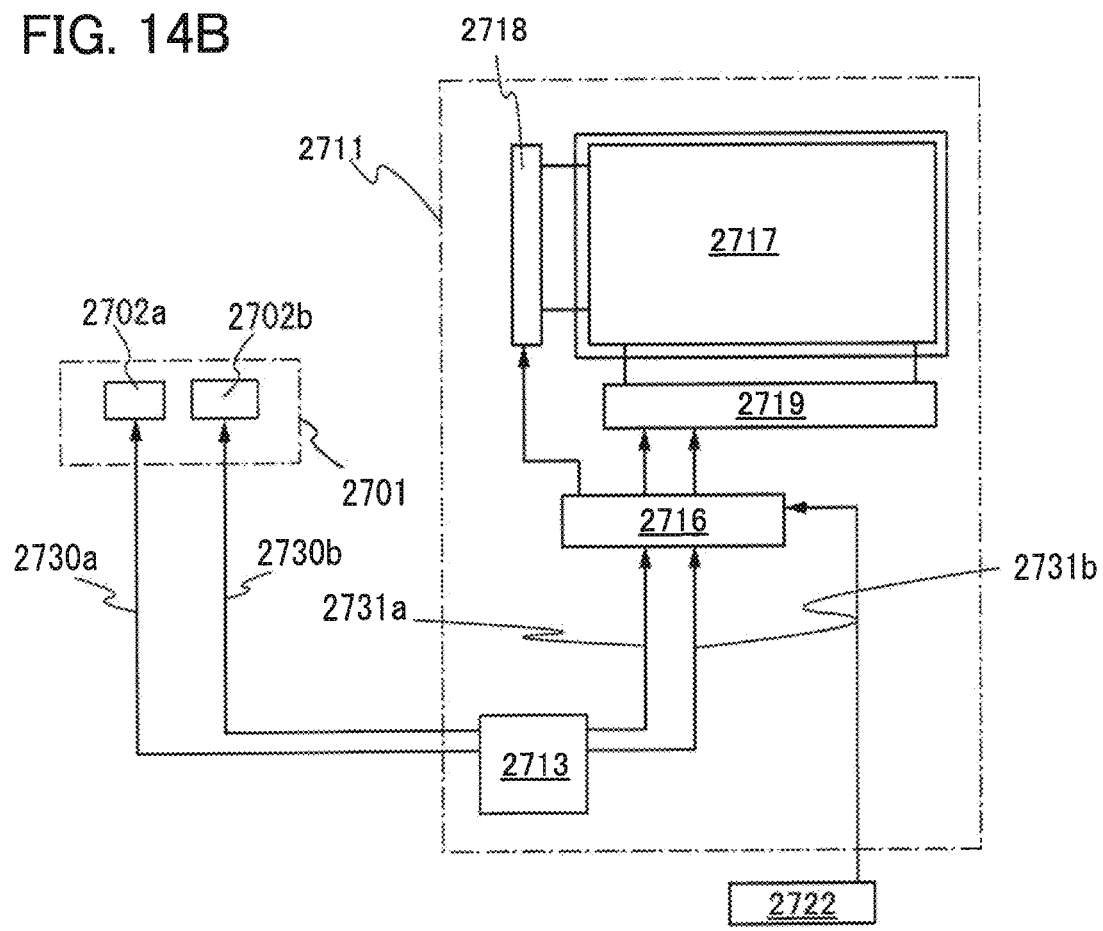

In addition, FIG. 14B is a block diagram illustrating a main structure of the display device 2711 and the dedicated glasses 2701.

The display device 2711 illustrated in FIG. 14B includes a display control circuit 2716, a display portion 2717, a timing generator 2713, a source line driver circuit 2718, an external operation unit 2722, and a gate line driver circuit 2719. Note that an output signal changes in accordance with operation by the external operation unit 2722 such as a keyboard.

In the timing generator 2713, a start pulse signal and the like are formed, and a signal for synchronizing an image for a left eye and the shutter of the panel 2702a for a left eye, a signal for synchronizing an image for a right eye and the shutter of the panel 2702b for a right eye, and the like are provided.

A synchronization signal 2731a of the image for a left eye is input to the display control circuit 2716, so that the image for a left eye is displayed on the display portion 2717. At the same time, a synchronization signal 2730a for opening the shutter of the panel 2702a for a left eye is input to the panel 2702a for a left eye. In addition, a synchronization signal 2731b of the image for a right eye is input to the display control circuit 2716, so that the image for a right eye is displayed on the display portion 2717. At the same time, a synchronization signal 2730b for opening the shutter of the panel 2702b for a right eye is input to the panel 2702b for a right eye.

Since switching between an image for a left eye and an image for a right eye is performed at high speed, the display device 2711 preferably employs a successive color mixing method (a field sequential method) in which color display is performed by time division with use of light-emitting diodes (LEDs).

Further, since a field sequential method is employed, it is preferable that the timing generator 2713 input signals synchronized with the synchronization signals 2730a and 2730b to the backlight portion of the light-emitting diodes. Note that the backlight portion includes LEDs of R, G, and B colors.

This embodiment can be freely combined with any of the other embodiments in this specification.

Embodiment 5

In this embodiment, examples of electronic appliances each including the display device described in the above embodiment will be described.

Figure 15A:
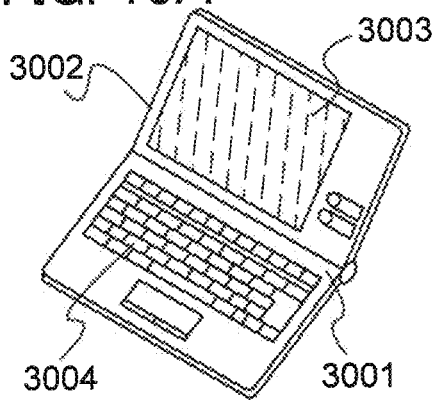
FIGS. 15A to 15F are views each illustrating an example of a usage pattern of an electronic device.

FIG. 15A illustrates a laptop personal computer, which includes a main body 3001, a housing 3002, a display portion 3003, a keyboard 3004, and the like. By using the liquid crystal display device described in the above embodiment, a highly reliable laptop personal computer can be obtained.

Figure 15B:
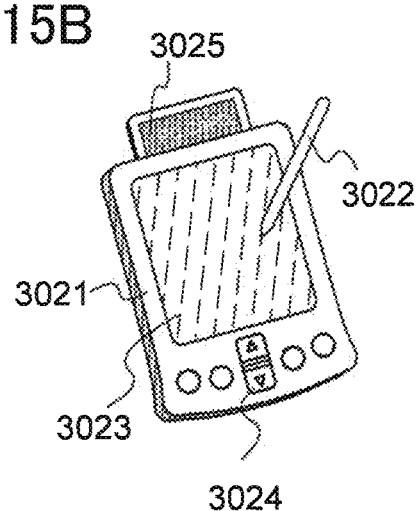

FIG. 15B is a personal digital assistant (PDA) which includes a main body 3021 provided with a display portion 3023, an external interface 3025, operation buttons 3024, and the like. A stylus 3022 is included as an accessory for operation. By using the liquid crystal display device described in the above embodiment, a highly reliable personal digital assistant (PDA) can be obtained.

Figure 15C:
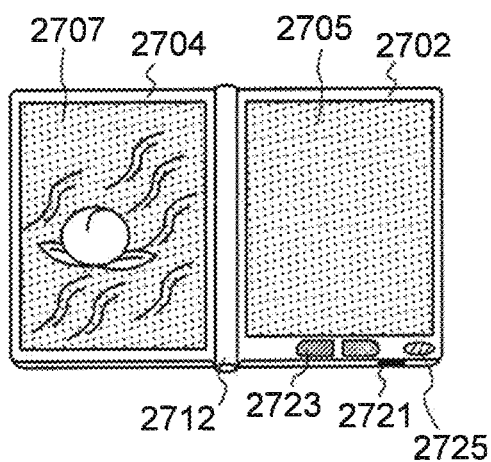

FIG. 15C illustrates an example of an e-book reader. For example, the e-book reader includes two housings, a housing 2702 and a housing 2704. The housing 2702 is combined with the housing 2704 by a hinge 2712, so that the e-book reader can be opened and closed with the hinge 2712 used as an axis. With such a structure, the e-book reader can operate like a paper book.

A display portion 2705 and a display portion 2707 are incorporated in the housing 2702 and the housing 2704, respectively. The display portion 2705 and the display portion 2707 may display one image or different images. In the structure where different images are displayed on different display portions, for example, the right display portion (the display portion 2705 in FIG. 15C) displays text and the left display portion (the display portion 2707 in FIG. 15C) displays images. By using the liquid crystal display device described in the above embodiment, a highly reliable e-book reader can be obtained.

FIG. 15C illustrates an example in which the housing 2702 is provided with an operation portion and the like. For example, the housing 2702 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 15D:
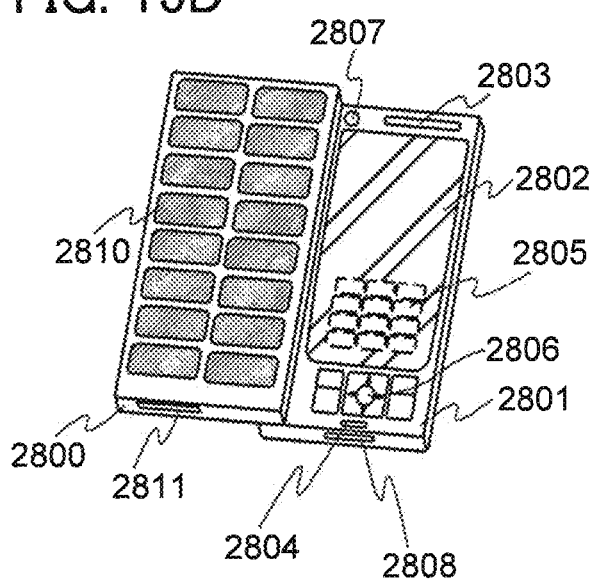

FIG. 15D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801.

The display panel 2802 is provided with a touch screen. A plurality of operation keys 2805 which is displayed as images is illustrated by dashed lines in FIG. 15D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 15D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the liquid crystal display device described in the above embodiment, a highly reliable mobile phone can be provided.

Figure 15E:
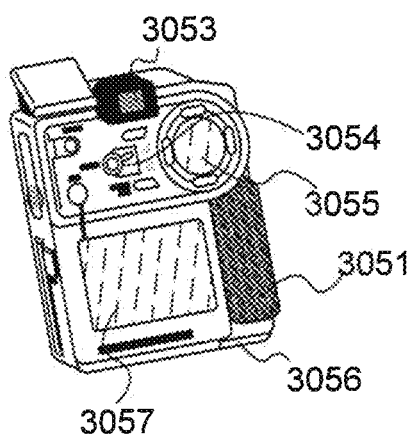

FIG. 15E illustrates a digital video camera which includes a main body 3051, a display portion A 3057, an eyepiece 3053, an operation switch 3054, a display portion B 3055, a battery 3056, and the like. By using the liquid crystal display device described in the above embodiment, a highly reliable digital video camera can be provided.

Figure 15F:
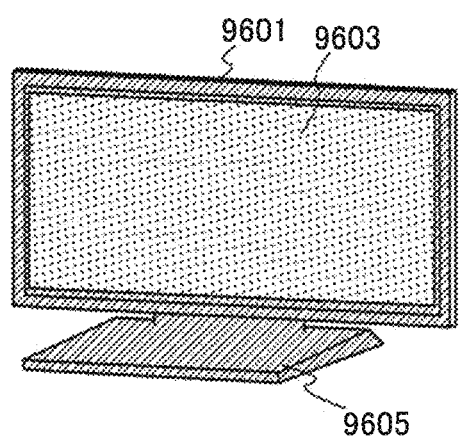

FIG. 15F illustrates an example of a television set. In the television set, a display portion 9603 is incorporated in a housing 9601. The display portion 9603 can display images. Here, the housing 9601 is supported by a stand 9605. By using the liquid crystal display device described in the above embodiment, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

This application is based on Japanese Patent Application serial no. 2010-203356 filed with Japan Patent Office on Sep. 10, 2010, the entire contents of which are hereby incorporated by reference.

What is claimed is:

1. A display device comprising:
a semiconductor layer over a substrate;
a gate wiring over the substrate, the gate wiring extending in a first direction;
a source wiring over the substrate, the source wiring extending in a second direction intersecting the first direction;
a capacitor wiring over the substrate, the capacitor wiring having a first part extending in parallel to the first direction, a second part extending along the source wiring, and a third part extending along an adjacent source wiring; and
a pixel electrode electrically connected to the semiconductor layer, the pixel electrode having a first end portion extending in parallel to the first direction, a second end portion overlapping with the second part of the capacitor wiring, and a third end portion overlapping with the third part of the capacitor wiring,
wherein each of the gate wiring and the capacitor wiring has a layered structure comprising a first layer comprising one of aluminum and copper and a second layer comprising one of molybdenum, titanium, and tungsten.

2. The display device according to claim 1, wherein the first part of the capacitor wiring intersects the source wiring.

3. The display device according to claim 1, wherein the first end portion of the pixel electrode overlaps with the first part of the capacitor wiring.

4. The display device according to claim 1, wherein the display device is a reflective type liquid crystal display device.

5. The display device according to claim 1, wherein the display device is a transmission type liquid crystal display device.

6. The display device according to claim 1, wherein the display device is applied to an electronic equipment selected from the group consisting of a video camera, a digital camera, a projector, a head mounted display, a mobile computer, a portable telephone and an electronic notebook.

7. A display device comprising:
a thin film transistor comprising a semiconductor layer over a substrate;
a gate wiring over the substrate, the gate wiring extending in a first direction;
a source wiring over the substrate, the source wiring extending in a second direction intersecting the first direction;

an interlayer insulating film over the thin film transistor;

a capacitor wiring over the substrate, the capacitor wiring having a first part extending in parallel to the first direction and second and third parts each extending in parallel to the second direction; and a pixel electrode electrically connected to the thin film transistor, the pixel electrode having a first end portion extending in parallel to the first direction, a second end portion overlapping with the second part of the capacitor wiring, and a third end portion overlapping with the third part of the capacitor wiring, wherein each of the gate wiring and the capacitor wiring has a layered structure comprising a first layer comprising one of aluminum and copper and a second layer comprising one of molybdenum, titanium, and tungsten.

8. The display device according to claim 7, wherein the first part of the capacitor wiring intersects the source wiring.

9. The display device according to claim 7, wherein the first end portion of the pixel electrode overlaps with the first part of the capacitor wiring.

10. The display device according to claim 7, wherein the display device is a reflective type liquid crystal display device.

11. The display device according to claim 7, wherein the display device is a transmission type liquid crystal display device.

12. The display device according to claim 7, wherein the display device is applied to an electronic equipment selected from the group consisting of a video camera, a digital camera, a projector, a head mounted display, a mobile computer, a portable telephone and an electronic notebook.

13. A television set including the display device according to claim 1.

14. A television set including the display device according to claim 7.

* * * * *